United States Patent
Zhang et al.

(10) Patent No.: US 12,336,384 B2
(45) Date of Patent: Jun. 17, 2025

(54) DISPLAY PANEL AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zhenhua Zhang, Beijing (CN); Yangpeng Wang, Beijing (CN); Yingsong Xu, Beijing (CN); Kuo Sun, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 506 days.

(21) Appl. No.: 17/797,259

(22) PCT Filed: Aug. 5, 2021

(86) PCT No.: PCT/CN2021/110961
§ 371 (c)(1),
(2) Date: Aug. 3, 2022

(87) PCT Pub. No.: WO2022/068393
PCT Pub. Date: Apr. 7, 2022

(65) Prior Publication Data
US 2023/0055596 A1     Feb. 23, 2023

(30) Foreign Application Priority Data

Sep. 29, 2020   (CN) .......................... 202011056670.7

(51) Int. Cl.
*H10K 59/121*     (2023.01)
*H10K 50/844*     (2023.01)
(Continued)

(52) U.S. Cl.
CPC ......... *H10K 59/121* (2023.02); *H10K 50/844* (2023.02); *H10K 59/131* (2023.02);
(Continued)

(58) Field of Classification Search
None
See application file for complete search history.

(56) References Cited

U.S. PATENT DOCUMENTS

2008/0150843 A1\* 6/2008 Yamamoto ........... G09G 3/3225
                                                        445/24
2009/0066608 A1\* 3/2009 Nakamura ............... G09G 3/12
                                                        345/55

(Continued)

OTHER PUBLICATIONS

CN 110189639A, Li et al, Display Substrate Display Panel and Display Device, Aug. 30, 2019 (Year: 2019).\*

*Primary Examiner* — Alexander G Ghyka
(74) *Attorney, Agent, or Firm* — XSENSUS LLP

(57) ABSTRACT

A display panel has a first region including a first display region and a second display region, the first display region includes a first sub-region and a second sub-region. The display panel includes: a substrate; light-emitting devices including first light-emitting devices located in the first display region and second light-emitting devices located in the second display region; pixel circuits including first pixel circuits coupled to the first light-emitting devices and second pixel circuits coupled to the second light-emitting devices; and signal lines. The first pixel circuits are located outside the first display region, and the second pixel circuits are located in the second display region. Each of at least one signal line of the signal lines is coupled to at least one first pixel circuit, and an orthogonal projection of the at least one signal line on the substrate overlaps the second sub-region, and does not overlap the first sub-region.

20 Claims, 30 Drawing Sheets

(51) Int. Cl.
  *H10K 59/131* (2023.01)
  *H10K 59/65* (2023.01)
  *H10K 77/10* (2023.01)
  *H10K 102/00* (2023.01)

(52) U.S. Cl.
  CPC ........... *H10K 59/65* (2023.02); *H10K 77/111* (2023.02); *H10K 2102/311* (2023.02)

(56) References Cited

U.S. PATENT DOCUMENTS

2019/0123060 A1\* 4/2019 Wang ..................... H10B 41/10
2020/0161400 A1\* 5/2020 Ka ......................... H10K 50/81

\* cited by examiner

DISPLAY PANEL AND DISPLAY APPARATUS

CROSS-REFERENCE TO RELATED APPLICATIONS

This application is a national phase entry under 35 USC 371 of International Patent Application No. PCT/CN2021/110961, filed on Aug. 5, 2021, which claims priority to Chinese Patent Application No. 202011056670.7, filed on Sep. 29, 2020, which are incorporated herein by reference in their entirety.

TECHNICAL FIELD

The present disclosure relates to the field of display technologies, and in particular, to a display panel and a display apparatus.

BACKGROUND

With the advent of the "full screen" era, a high screen-to-body ratio has become a new development trend for electronic devices such as mobile phones and notebook computers. The screen-to-body ratio refers to a ratio of a screen area of a display screen to an area of an entire front face of the display screen. The display screen is designed as a special-shaped display screen with a notch region, such as a bang screen or a water drop screen. The notch region may be used to arrange a sensor of the display screen, such as a camera or a light sensor, so as to improve the screen-to-body ratio of the screen. However, the special-shaped display screen is not a true "full screen", and display cannot be realized in the notch region of the display screen, thereby reducing the screen-to-body ratio.

In the related art, by providing the sensor under the display screen, e.g., by placing the camera under the display screen, both a sensing function and display may be realized in a region of the display screen above the sensor, thereby improving the screen-to-body ratio.

SUMMARY

In an aspect, a display panel is provided. The display panel has a first region. The first region includes a first display region and a second display region. The first display region includes a first sub-region and a second sub-region. The display panel includes a substrate, a plurality of light-emitting devices, a plurality of pixel circuits and a plurality of signal lines. The plurality of light-emitting devices are disposed on the substrate. The plurality of light-emitting devices include first light-emitting devices located in the first display region and second light-emitting devices located in the second display region. The plurality of pixel circuits are disposed on the substrate. The plurality of pixel circuits include first pixel circuits coupled to the first light-emitting devices and second pixel circuits coupled to the second light-emitting devices. The first pixel circuits are located outside the first display region, and the second pixel circuits are located in the second display region. The plurality of signal lines are disposed on the substrate. The plurality of signal lines are coupled to the plurality of pixel circuits. The plurality of signal lines are configured to provide operating signals to the plurality of pixel circuits. Each of at least one signal line of the plurality of signal lines is coupled to at least one first pixel circuit. An orthogonal projection of the at least one signal line on the substrate overlaps the second sub-region, and does not overlap the first sub-region.

In some embodiments, the display panel further has a second region and a bending region. The first region and the second region are connected through the bending region. The display panel is configured to bend a portion of the display panel located in the second region onto a back of a portion of the display panel located in the first region by bending a portion of the display panel located in the bending region. One or more first pixel circuits are located in the second region. The portion of the display panel located in the second region is bent onto the back of the portion located in the first region, and orthogonal projections of the one or more first pixel circuits located in the second region on a portion of the substrate located in the first region does not overlap the first display region.

In some embodiments, the at least one signal line has at least one opening, and the at least one opening is located in the bending region.

In some embodiments, each of the at least one signal line includes a first pattern, a second pattern and a third pattern. The first pattern is located in the bending region. The second pattern is located in the first region, and the second pattern is coupled to at least one second pixel circuit and the first pattern. The third pattern is located in the second region, and the third pattern is coupled to the at least one first pixel circuit and the first pattern. A tensile modulus of the first pattern is greater than a tensile modulus of the second pattern and a tensile of the third pattern.

In some embodiments, the plurality of signal lines include first signal lines and second signal lines. The first signal lines each include a first pattern, a second pattern and a third pattern. First patterns of the first signal lines and the second signal lines are made of a same material.

In some embodiments, the display panel further includes a plurality of connection leads. The plurality of connection leads are disposed on the substrate. A first light-emitting device is coupled to a first pixel circuit through a connection lead. A portion of at least one connection lead located in at least the first display region is transparent.

In some embodiments, the at least one connection lead includes a fourth pattern and a fifth pattern. The fourth pattern is located in the first display region, and the fourth pattern is coupled to a first light-emitting device. The fifth pattern is located outside the first display region, and the fifth pattern is coupled to the fourth pattern and a first pixel circuit. A tensile modulus of the fifth pattern is greater than a tensile modulus of the fourth pattern.

In some embodiments, the at least one signal line includes a second signal line, and the fifth pattern and the second signal line are made of a same material.

In some embodiments, the portion of the display panel located in the second region includes a transparent portion. Orthogonal projections of the first pixel circuits on the substrate do not overlap the transparent portion. In a case where the portion of the display panel located in the second region is bent onto the back of the portion of the display panel located in the first region, the first sub-region is located in a region where an orthogonal projection of the transparent portion on the portion of the substrate located in the first region.

In some embodiments, the plurality of light-emitting devices further include third light-emitting devices. The third light-emitting devices are located on the transparent portion. The plurality of pixel circuits further include third pixel circuits. The third pixel circuits are located in the second region. The third pixel circuits are coupled to the third light-emitting devices. Orthogonal projections of the third pixel circuits on the substrate do not overlap an orthogonal projection of the transparent portion on the substrate. In a case where the portion of the display panel located in the second region is bent onto the back of the portion of the display panel located in the first region, orthogonal projections of the third light-emitting devices on the portion of the substrate located in the first region are located within the first display region, and do not overlap orthogonal projections of the first light-emitting devices on the substrate.

In some embodiments, in a case where the portion of the display panel located in the second region is bent onto the back of the portion of the display panel located in the first region, an arrangement of the first light-emitting devices and the third light-emitting devices as a whole is same as an arrangement of the second light-emitting devices.

In some embodiments, the display panel further includes transparent conductive lines. The transparent conductive lines are disposed on the substrate. The third light-emitting devices are coupled to the third pixel circuits through the transparent conductive lines.

In some embodiments, the transparent portion is an opening, and a depth direction of the opening is perpendicular to a plane where a portion of the substrate located in the second region is located.

In some embodiments, a plurality of pixel circuits located in the second region are arranged in an array, and along a row direction in which the pixel circuits in the second region are arranged, the pixel circuits in the second region are located on at least one of two opposite sides of the transparent portion.

In some embodiments, along a column direction in which pixel circuits located in the second region are arranged, a width of the pixel circuits located in the second region as a whole is less than or equal to a width of the first display region.

In some embodiments, the pixel circuits located in the second region are divided into at least two groups. Different groups are arranged along a row direction in which the pixel circuits located in the second region are arranged, and each group includes at least one row of pixel circuits. All rows of pixel circuits in the at least two groups are in one-to-one correspondence with a plurality of rows of pixel circuits located in the second display region. Each row of pixel circuits in each group and a corresponding row of pixel circuits located in the second display region are coupled to at least one same signal line.

In some embodiments, the display panel further includes a first encapsulation layer, a second encapsulation layer and a third encapsulation layer. The first encapsulation layer covers the plurality of pixel circuits and the plurality of light-emitting devices. The second encapsulation layer is farther away from the substrate than the first encapsulation layer, and the second encapsulation layer covers the second pixel circuits. The third encapsulation layer is located between the first encapsulation layer and the second encapsulation layer, and the third encapsulation layer covers the plurality of light-emitting devices.

In some embodiments, the plurality of light-emitting devices include third light-emitting devices, and the second encapsulation layer further covers the third light-emitting devices.

In some embodiments, the display panel further has a bonding region. In a case where the display panel has a second region and a bending region, the bonding region is located on a side of the second region away from the bending region; or, the bonding region is located on a side of the first region away from the bending region.

In another aspect, a display apparatus is provided. The display apparatus includes the display panel according to any one of the above embodiments and a sensor.

The sensor is disposed on a back of a portion of the display panel located in the first display region. An orthogonal projection of the sensor on the display panel is located in the first sub-region of the first display region.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings.

In addition, the accompanying drawings to be described below may be regarded as schematic diagrams, but are not limitations on actual sizes of products, actual processes of methods, and actual timings of signals involved in the embodiments of the present disclosure.

DETAILED DESCRIPTION

Figure 1A:
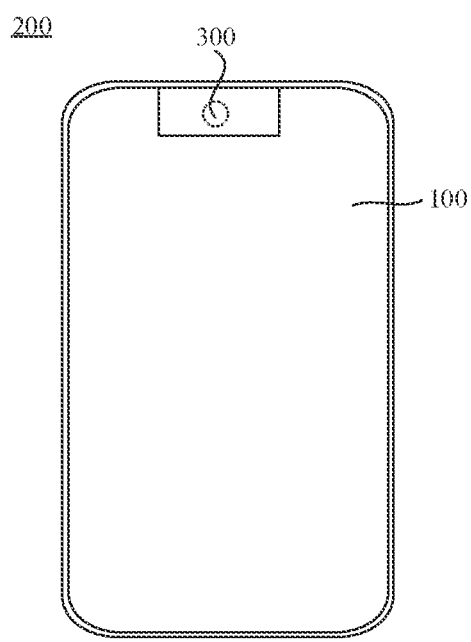
FIG. 1A is a structural diagram of a display apparatus, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description, the term such as "one embodiment," "some embodiments," "exemplary embodiments," "example," "specific example" or "some examples" is intended to indicate that specific features, structures, materials or characteristics related to the embodiment(s) or example(s) are included in at least one embodiment or example of the present disclosure. Schematic representation of the above term does not necessarily refer to the same embodiment(s) or example(s). In addition, the specific features, structures, materials or characteristics may be included in any one or more embodiments or examples in any suitable manner. Hereinafter, the terms "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "multiple," "a plurality of" or "the plurality of" means two or more unless otherwise specified.

In the description of some embodiments, the terms "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "applicable to" or "configured to" as used herein indicates an open and inclusive expression, which does not exclude devices that are applicable to or configured to perform additional tasks or steps.

Exemplary embodiments are described herein with reference to sectional views and/or plan views as idealized exemplary drawings. In the accompanying drawings, thicknesses of layers and sizes of regions are enlarged for clarity. Thus, variations in shapes with respect to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Some embodiments of the present disclosure provide a display apparatus 200. As shown in FIG. 1A, the display apparatus 200 includes a display panel 100 and a sensor 300. For example, the display apparatus 200 may be a display, or may be a product including a display, such as a television, a computer (an all-in-one computer or a desktop computer), a tablet computer, a mobile phone, or an electronic display screen. For example, the display panel 100 may be a light-emitting diode (LED) display panel, or an organic light-emitting diode (OLED) display panel. For example, the sensor 300 may be an optical sensor, such as a camera or a light sensor. For example, the camera may be a front camera of the display apparatus.

It will be noted that, the number of sensors may be designed according to actual situations, which is not limited herein. For example, there may be one or more sensors.

Figure 1B:
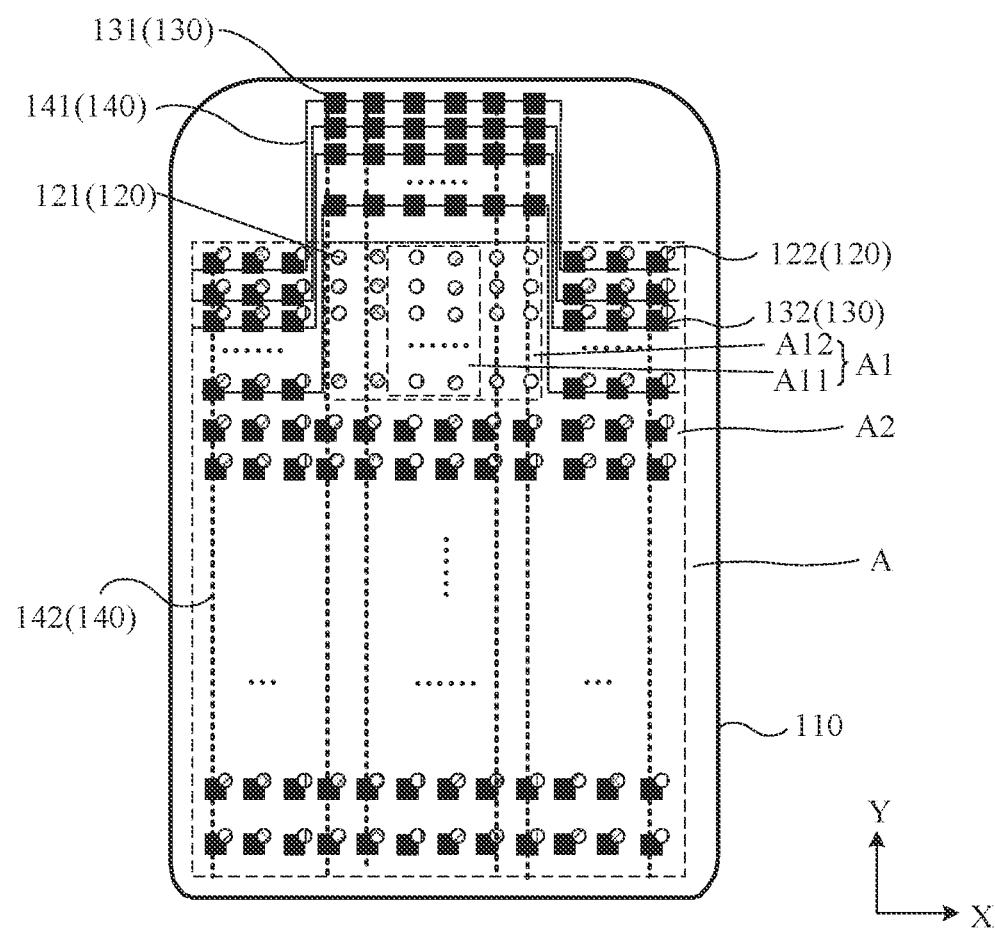
FIG. 1B is a structural diagram of a display panel, in accordance with some embodiments.

Some embodiments of the present disclosure provide the display panel 100. As shown in FIG. 1B, the display panel 100 has a first region A.

As shown in FIG. 1B, the first region A includes a first display region A1 and a second display region A2. It will be noted that, the number of first display regions, shapes of the first display region and the second display region, and a positional relationship between the first display region and the second display region may be designed according to actual situations, which are not limited herein. For example, there may be one or more first display regions. For example, the second display region A2 may be located on at least one side of the first display region A1. For example, the second display region A2 may surround the first display region A1. Alternatively, in a case where the first display region A1 has a quadrilateral shape, the second display region A2 may be located outside three consecutively distributed borders of the first display region A1. For example, in a case where the first display region A1 and the second display region A2 both have a rectangular shape (or a shape of a rounded rectangle), a border of the second display region A2 may have a depression portion (a depression direction being a direction pointing from an edge to a center of the display panel 100), and the first display region A1 is located in a depression region. For example, an area of the first display region A1 is smaller than or equal to an area of the second display region A2.

In the related art, the first display region and the second display region are each provided with pixels, and a density (i.e., pixels per inch (PPI)) of pixels in the first display region is smaller than that of pixels in the second display region. Thus, a resolution of the first display region is smaller than that of the second display region. In this case, a transmittance of the first display region may be improved by reducing the density of the pixels in the first display region, but display effects of the display panel in the first display region and the second display region may not be uniform, thereby reducing a display effect.

As shown in FIG. 1B, the display panel 100 in the embodiments of the present disclosure includes a substrate 110, a plurality of light-emitting devices 120, a plurality of pixel circuits 130, and a plurality of signal lines 140. The plurality of light-emitting devices 120 and the plurality of pixel circuits 130 are disposed on the substrate 110. The plurality of signal lines 140 are disposed on the substrate 110. Each of at least one signal line 140 of the plurality of signal lines 140 is coupled to at least one first pixel circuit 131. The plurality of signal lines 140 are coupled to the plurality of pixel circuits 130. The plurality of signal lines 140 are configured to provide operating signals to the plurality of pixel circuits 130 to cause the plurality of pixel circuits 130 to output driving signals. For example, the plurality of pixel circuits 130 output driving signals in response to the operating signals transmitted by the plurality of signal lines 140, so as to drive the plurality of light-emitting devices 120 to emit light. For example, the plurality of pixel circuits 130 generate driving signals (e.g., driving currents) in response to the operating signals transmitted by the plurality of signal lines 140, and transmit the driving signals to the plurality of light-emitting devices 120, so as to drive the plurality of light-emitting devices 120 to emit light. The plurality of signal lines 140 include gate lines and data lines. For example, a material of the plurality of signal lines 140 includes metal.

For example, at least one first pixel circuit and at least one second pixel circuit may be coupled to a same signal line. For example, in a case where a plurality of light-emitting devices in the first region are arranged in an array, a first pixel circuit and a second pixel circuit that are coupled to a row of light-emitting devices are coupled to a signal line, and the row of light-emitting devices synchronously emit light; and a first pixel circuit and a second pixel circuit that are coupled to a column of light-emitting devices are coupled to a signal line.

For example, the substrate 110 may include a flexible base such as polyimide (PI), and may further include a thin film such as a buffer layer disposed on the flexible base.

It will be noted that, a specific structure of the pixel circuit is not limited in the embodiments of the present disclosure, which may be designed according to actual situations. For example, the pixel circuit is composed of electronic devices such as a thin film transistor (TFT) and a capacitor (C). For example, the pixel circuit may be a pixel circuit with a 2T1C structure, which is composed of two thin film transistors (one switching transistor and one driving transistor) and one capacitor. Alternatively, the pixel circuit may be a pixel circuit composed of more than two thin film transistors (two or more switching transistors and one driving transistor) and at least one capacitor. For example, referring to FIG. 4A, the pixel circuit 130 may be a pixel circuit with a 7T1C structure, which is composed of one capacitor Cst and seven transistors (six switching transistors (M1, M2, M3, M5, M6 and M7) and one driving transistor M4).

Figure 4A:
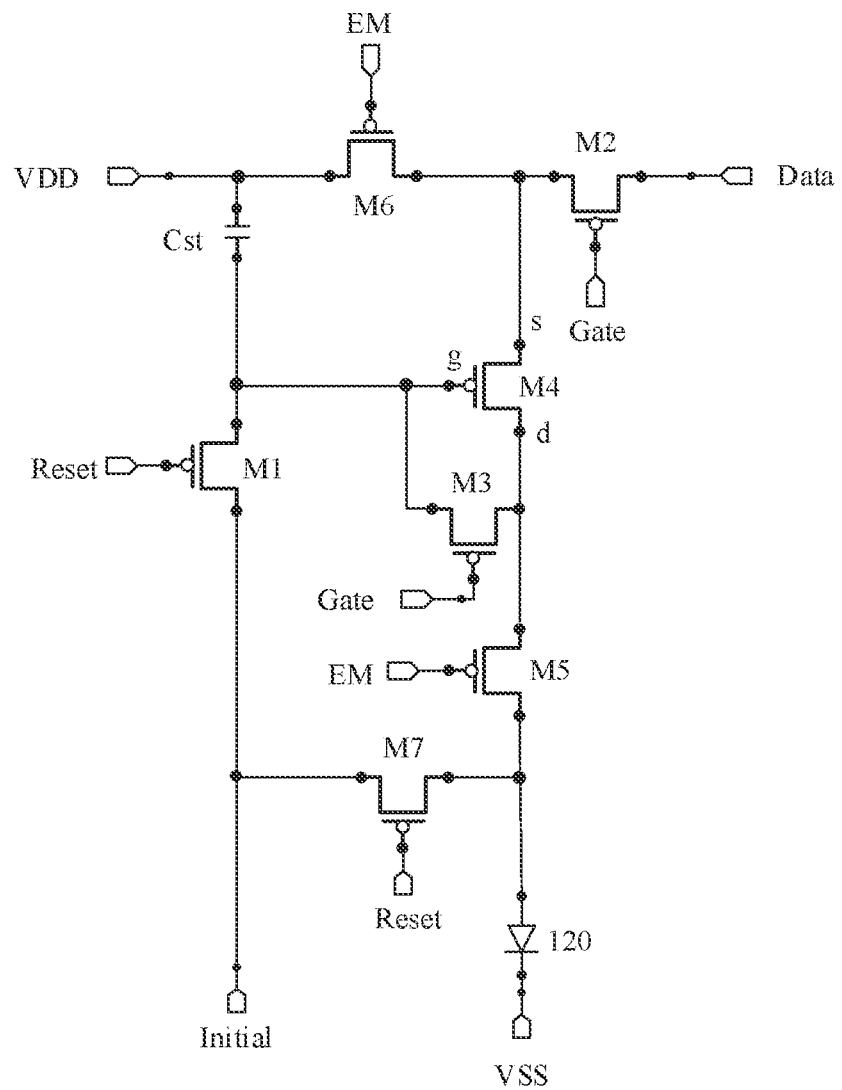
FIG. 4A is a structural diagram of a pixel circuit, in accordance with some embodiments.
Figure 4B:
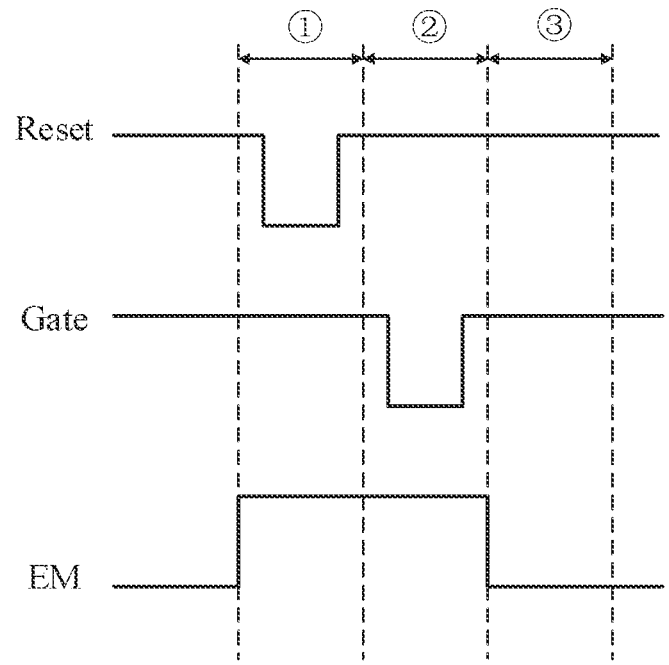
FIG. 4B is a driving timing diagram of a pixel circuit, in accordance with some embodiments.

For example, as shown in FIG. 4A, control electrodes (gates) of a part of the switching transistors (e.g., switching transistors M1 and M7) are used to receive a reset signal Reset shown in FIG. 4B; control electrodes of another part of the switching transistors (e.g., switching transistors M2 and M3) are used to receive a gate driving signal Gate shown in FIG. 4B; control electrodes of yet another part of the switching transistors (e.g., switching transistors M5 and M6) are used to receive a light-emitting control signal EM shown in FIG. 4B. The operating process of the pixel circuit shown in FIG. 4A includes three periods shown in FIG. 4B, which are a first period ①, a second period ②, and a third period 33). For example, in the first period ①, the transistor M1 and the transistor M7 are turned on in response to the reset signal Reset, and the transistor M1 and the transistor M7 transmit an initial signal Initial to a control electrode g of the driving transistor M4 and an anode of the light-emitting device 120 respectively, so as to achieve a purpose of resetting the anode of the light-emitting device 120 and the control electrode of the driving transistor M4. In the second period ②, the transistor M2 is turned on under control of the gate driving signal Gate, the control electrode g of the driving transistor M4 is coupled to a drain d thereof, and the driving transistor M4 is in a diode conducting state. At this time, a data signal Data is written into a source s of the driving transistor M4 through the transistor M2, and a threshold voltage (Vth) of the driving transistor M4 is compensated. In the third period ③, the transistor M5 and the transistor M6 are turned on under control of the light-emitting control signal EM, and a current path between a first power supply signal VDD and a second power supply signal VSS is turned on. Thus, a driving current ($I_{sd}$) generated by the driving transistor M4 is transmitted to the light-emitting device 120 through the current path, so as to drive the light-emitting device 120 to emit light.

Figure 5:
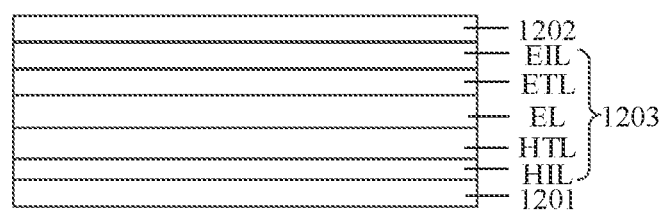
FIG. 5 is a structural diagram of a light-emitting device, in accordance with some embodiments.

Moreover, the light-emitting device may be a current-driven light-emitting device including an LED or an OLED. For example, as shown in FIG. 5, the light-emitting device 120 includes a cathode 1202, an anode 1201, and a light-emitting functional layer 1203 located between the cathode 1202 and the anode 1201. The light-emitting functional layer 1203 may include, for example, a light-emitting layer EL, a hole transport layer HTL located between the light-emitting layer EL and the anode 1201, and an electron transport layer ETL located between the light-emitting layer EL and the cathode 1202. Of course, according to needs, in some embodiments, a hole injection layer HIL may be provided between the hole transport layer HTL and the anode 1201, and an electron injection layer EIL may be provided between the electron transport layer ETL and the cathode 1202.

For example, the anode may be made of a transparent conductive material with a high work function, and a material of the anode may include indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), or a carbon nanotube; the cathode may be made of a material with a high conductivity and a low work function, and a material of the cathode may include an alloy such as a magnesium aluminum (MgAl) alloy or a lithium aluminum (LiAl) alloy, or a simple metal such as magnesium (Mg), aluminum (Al), lithium (Li) or silver (Ag). A material of the light-emitting layer may be selected according to different colors of light emitted by the light-emitting layer. For example, the material of the light-emitting layer includes a fluorescent light-emitting material or a phosphorescent light-emitting material. For example, in at least one embodiment of the present disclosure, the light-emitting layer may adopt a doping system. That is, a dopant material is mixed into a host light-emitting material to obtain a usable light-emitting material. For example, the host light-emitting material may be a metal compound material, a derivative of anthracene, an aromatic diamine compound, a triphenylamine compound, an aromatic tri-amine compound, a derivative of biphenyldiamine, or a triarylamine polymer.

As shown in FIG. 1B, the plurality of light-emitting devices 120 include first light-emitting devices 121 and second light-emitting devices 122. The first light-emitting devices 121 are located in the first display region A1, and the second light-emitting devices 122 are located in the second display region A2. The plurality of pixel circuits 130 include first pixel circuits 131 and second pixel circuits 132. The first pixel circuits 131 are coupled to the first light-emitting devices 121, and the second pixel circuits 132 are coupled to the second light-emitting devices 122. The first pixel circuits 131 are located outside the first display region A1, and the second pixel circuits 132 are located in the second display region A2.

Furthermore, as shown in FIG. 1B, the first display region A1 includes a first sub-region A11 and a second sub-region A12. For example, the second sub-region A12 is located on at least one side of the first sub-region A11. For example, the second sub-region A12 is located around the first sub-region A11. An orthogonal projection of at least one signal line 140 on the substrate 110 overlaps the second sub-region A12, and does not overlap the first sub-region A11.

For example, the first region further includes a peripheral region located outside the first display region and the second display region. The first pixel circuits may be located in the peripheral region. For example, an orthogonal projection of a signal line coupled to a row of second pixel circuits in the plurality of signal lines on the substrate does not overlap the first sub-region. For example, the signal line coupled to the row of second pixel circuits in the plurality of signal lines bypasses the first sub-region, and is coupled to first pixel circuit(s) via the second sub-region to be. A signal line coupled to a column of second pixel circuits in the plurality of signal lines may be coupled to first pixel circuit(s) via the second sub-region.

For example, the first pixel circuits 131 and the second pixel circuits 132 are driven in a same way. For example, in a case where the pixel circuits are arranged in an array, the second pixel circuits 132 are driven row by row from a first row to a last row, and the first pixel circuits 131 are also driven row by row from a first row to a last row. For example, pixel circuits in the first region and pixel circuits in the second region are driven by a same scan driver circuit (e.g., a gate driver circuit). In this way, image display may be realized without changing a driving algorithm of the display panel.

It can be understood that, the pixel circuits coupled to the first light-emitting devices in the first display region are arranged outside the first display region, and there is no pixel circuit in the first display region, so that light passing through the first display region is not blocked by the pixel circuits. Consequently, the transmittance and an aperture ratio of the first display region may be improved. The transmittance of the first display region is greater than that of the second display region. In this case, there is more space in the first display region for arranging the light-emitting devices, which may improve the PPI of the first display region, and make the PPI of the first display region equal to that of the second display region. Therefore, the display effects in the first display region and the second display region may be uniform, and the display effect of the display panel is improved. In addition, an orthogonal projection of at least one signal line on the substrate overlaps the second sub-region, and does not overlap the first sub-region. In this case, the signal line does not block the first sub-region either, so that a transmittance of the first sub-region is greater than that of the second sub-region, and the transmittance of the first sub-region is improved.

Moreover, the sensor (e.g., the camera or the light sensor) is arranged on a back of a portion of the display panel located in the first sub-region. That is, the sensor is arranged on a side of the display panel away from a display surface of the display panel. An orthogonal projection of the sensor on the display panel is located in the first sub-region. There is no pixel circuit in the first sub-region and no signal line in the first sub-region to block light, so that a transmittance of the light is improved, the light is not blocked by the signal line when passing through the first sub-region, and the diffraction of the light may be avoided. Therefore, the sensor may well sense optical signals, and in turn, an under-screen sensing effect of the display panel may be improved. In addition, since there is no pixel circuit in the second sub-region, there is enough space in the second sub-region for wiring. As a result, the space for wiring is increased.

It will be noted that, a wiring manner of the plurality of signal lines 140 may be designed according to actual situations, such as a positional relationship between the first sub-region and the second sub-region, which is not limited herein. For example, as shown in FIG. 1B, the second sub-region A12 is located around the first sub-region A11, and the plurality of signal lines 140 may be routed on two opposite sides of the first sub-region A11 along a direction X.

Therefore, for the display panel provided in the embodiments of the present disclosure, by arranging the first pixel circuits coupled to the first light-emitting devices outside the first display region, there is no pixel circuit in the first display region, and the light passing through the first display region is not blocked by the pixel circuit. Consequently, the transmittance and the aperture ratio of the first display region may be improved, and the transmittance of the first display region greater than that of the second display region. In this way, there is more space in the first display region for arranging the light-emitting devices, so that the PPI of the first display region may be improved, and the PPI of the first display region equal to that of the second display region. Therefore, the display effects in the first display region and the second display region may be uniform, and the display effect of the display panel may be improved. In addition, the orthogonal projection of the at least one signal line on the substrate overlaps the second sub-region, and does not overlap the first sub-region, and the signal line does not block the first sub-region either, so that the transmittance of the first sub-region is greater than that of the second sub-region, and the transmittance of the first sub-region may be improved. Moreover, the light is not blocked by the signal line when passing through the first sub-region, so that the diffraction of the light may be avoided. In this case, by providing the sensor (e.g., the camera or the light sensor) on the back of the portion of the display panel located in the first sub-region, the sensor may well sense the optical signals, and in turn, the under-screen sensing effect of the display panel may be improved.

Figure 2A:
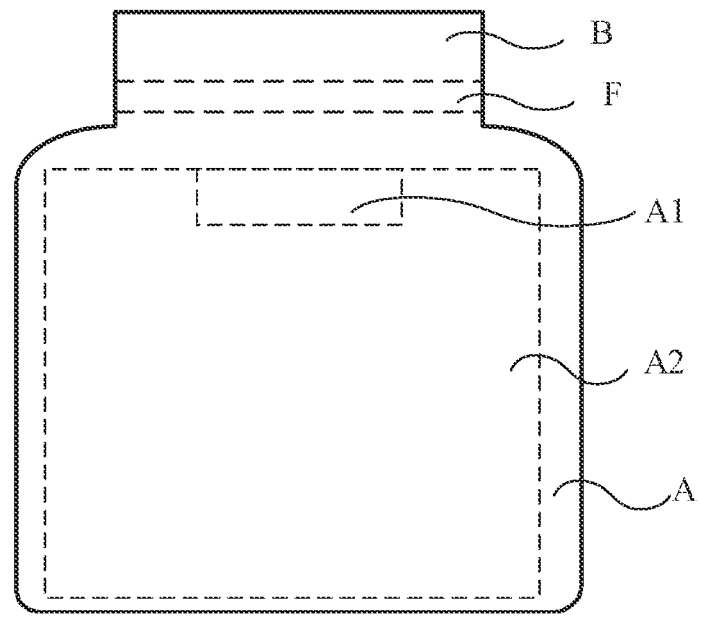
FIG. 2A is a diagram of a display panel in an unfolded state, in accordance with some embodiments.
Figure 2B:
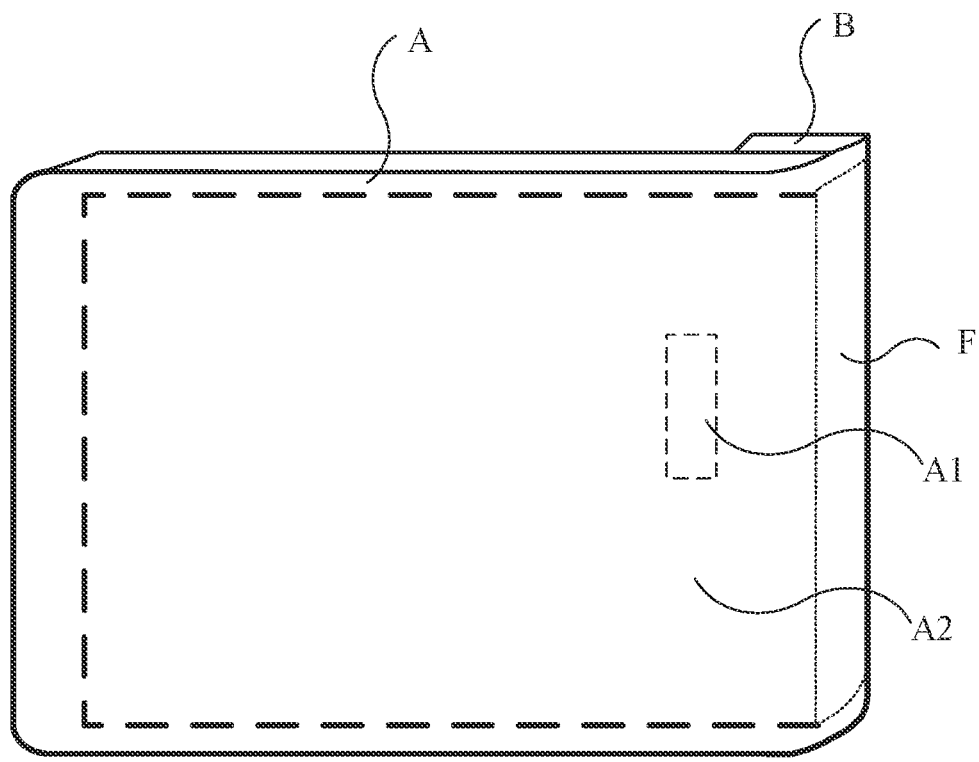
FIG. 2B is a diagram of a display panel in a bending state, in accordance with some embodiments.

In some embodiments, as shown in FIGS. 2A and 2B, the display panel 100 further has a second region B and a bending region F. The bending region F is located between the first region A and the second region B, and the first region A and the second region B are connected through the bending region F. The display panel 100 is configured to bend a portion of the display panel 100 located in the second region B onto a back of a portion of the display panel 100 located in the first region A by bending a portion of the display panel 100 located in the bending region F.

It will be noted that, positions and sizes of the first region A, the second region B and the bending region F may be designed according to actual situations, which are not limited herein. For example, an area of the first region A is greater than that of the second region B, and is also greater than that of the bending region F. The area of the second region B is greater than that of the bending region F. For example, the bending region F is located on a side of the first region A, and the second region B is located on a side of the bending region F away from the first region A.

The display panel 100 is a flexible display panel. The back of the portion of the display panel 100 located in the first region A refers to a side of the portion of the display panel 100 located in the first region A, which is away from the display surface (or a light-exiting surface) of the display panel 100.

Figure 3:
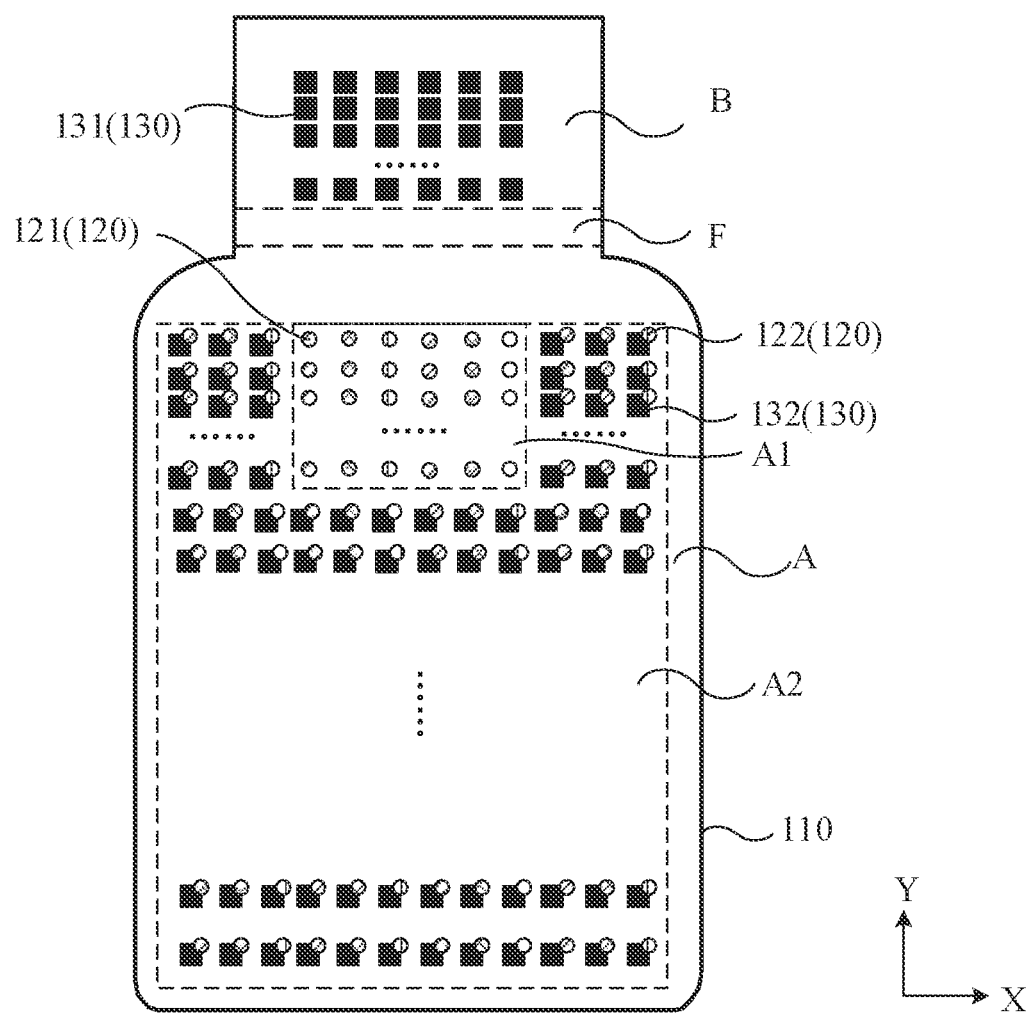
FIG. 3 is a structural diagram of another display panel, in accordance with some embodiments.

As shown in FIG. 3, at least one first pixel circuit 131 is located in the second region B. For example, all the first pixel circuits 131 are located in the second region B. In addition, in a case where the portion of the display panel 100 located in the second region B is bent onto the back of the portion of the display panel 100 located in the first region A, orthogonal projection(s) of the first pixel circuit(s) 131 on a portion of the substrate 110 located in the first region A do not overlap the first display region A1.

Figure 6:
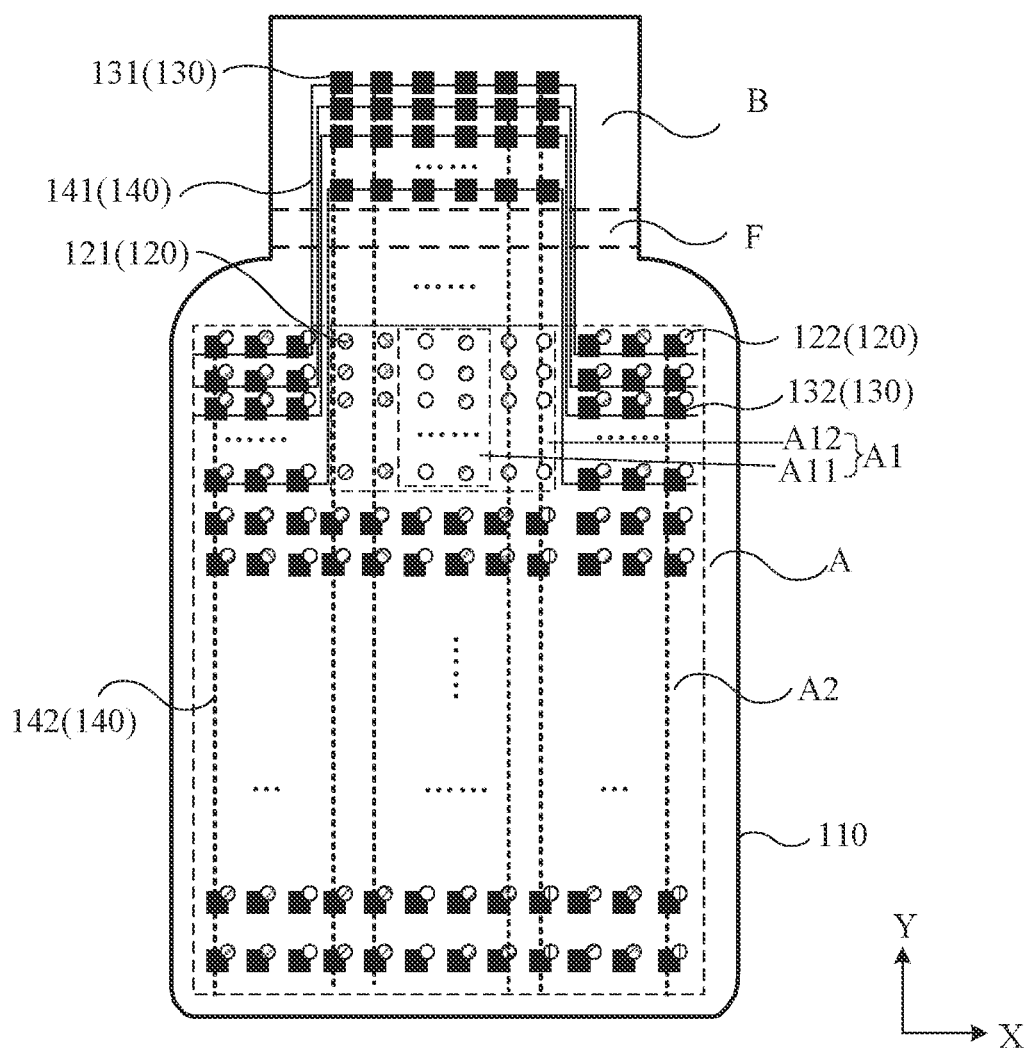
FIG. 6 is a structural diagram of yet another display panel, in accordance with some embodiments.

In this way, by providing the at least one first pixel circuit in the second region, it may be possible to reduce the number of and space occupied by pixel circuits arranged outside the first display region of the first region, and reduce a size of the peripheral region of the first region. In addition, in a case where a plurality of sensors are arranged on the back of the display panel, the area of the second region may be increased to arrange more pixel circuits, and there is no requirement for a relatively large space in the peripheral region of the first region, so that the size of the peripheral region may be reduced. Moreover, since the portion of the display panel located in the second region is bent onto the back of the portion located in the first region, a bezel of the display panel will not be widen, and the bezel of the display panel may be narrow, which is conducive to achieving the narrow bezel of the display panel. For example, as shown in FIG. 6, an orthogonal projection of a signal line 140 coupled to a row of second pixel circuits 132 (e.g., second pixel circuits arranged in a line along a direction X in FIG. 6) in the plurality of signal lines 140 on the substrate 110 does not overlap the first sub-region A11. For example, the signal line coupled to the row of second pixel circuits 132 bypasses the first sub-region A11, and extends to the second region B via the second sub-region A12 and the bending region F to be coupled to first pixel circuits 131; a signal line 140 coupled to a column of second pixel circuits 132 (e.g., second pixel circuits arranged in a line along a direction Y in FIG. 6) in the plurality of signal lines 140 may extend to the second region B via the second sub-region A12 and the bending region F to be coupled to first pixel circuits 131.

For example, in the second sub-region A12, an orthogonal projection of at least one signal line 140 on the substrate 110 overlaps an orthogonal projection of at least one first light-emitting device 121 on the substrate 110. In this way, the at least one first light-emitting device 121 blocks the at least one signal line 140, so that the aperture ratio of the first display region A1 may be improved, and the transmittance of the first display region A1 may be improved.

Figure 7:
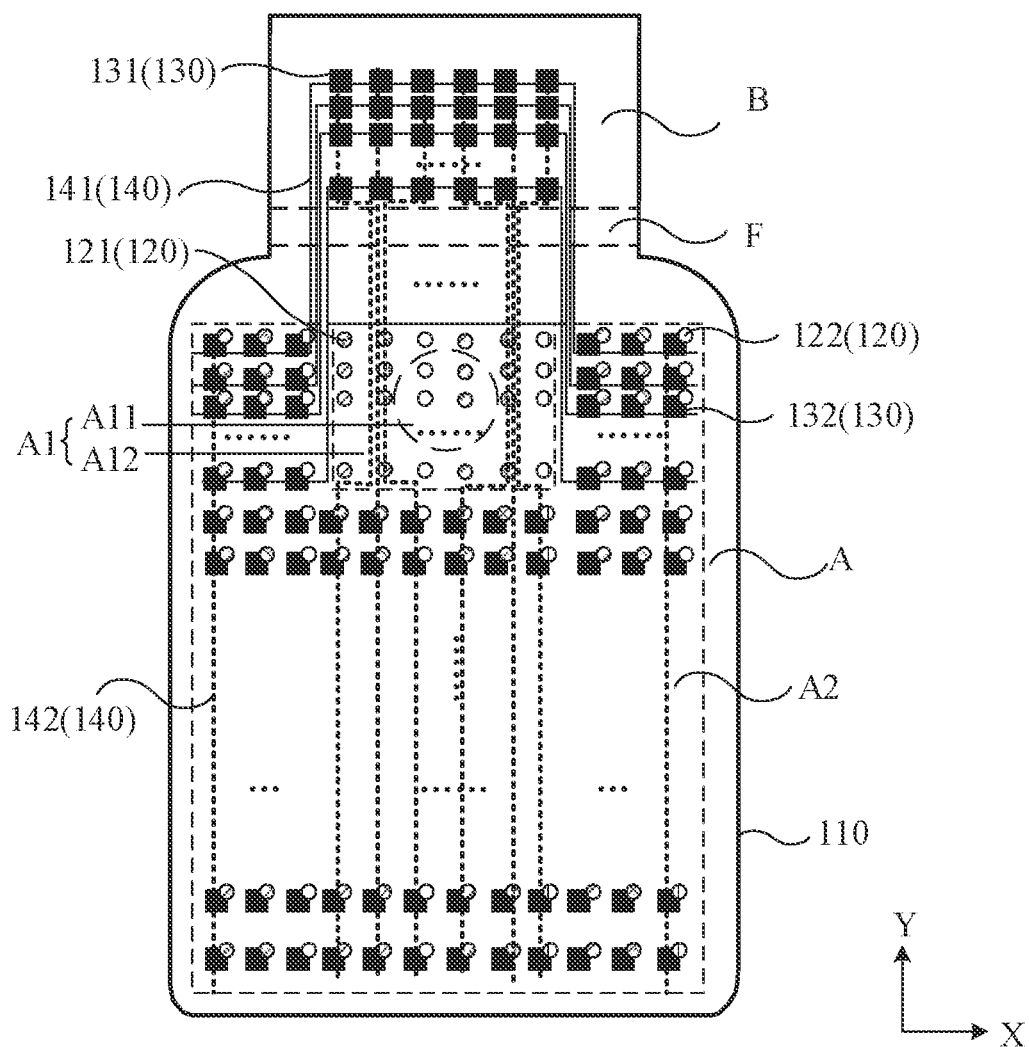
FIG. 7 is a structural diagram of yet another display panel, in accordance with some embodiments.

It will be noted that, the wiring manner of the plurality of signal lines 140 may be designed according to actual situations, such as the positional relationship between the first sub-region and the second sub-region, which is not limited herein. For example, as shown in FIG. 7, the second sub-region A12 is located around the first sub-region A11, and the plurality of signal lines 140 may be routed on two opposite sides of the first sub-region A11 along the direction X. For example, in the second sub-region A12, a distance between at least two adjacent signal lines 140 is smaller than a distance between two adjacent light-emitting devices 120.

Figure 8A:
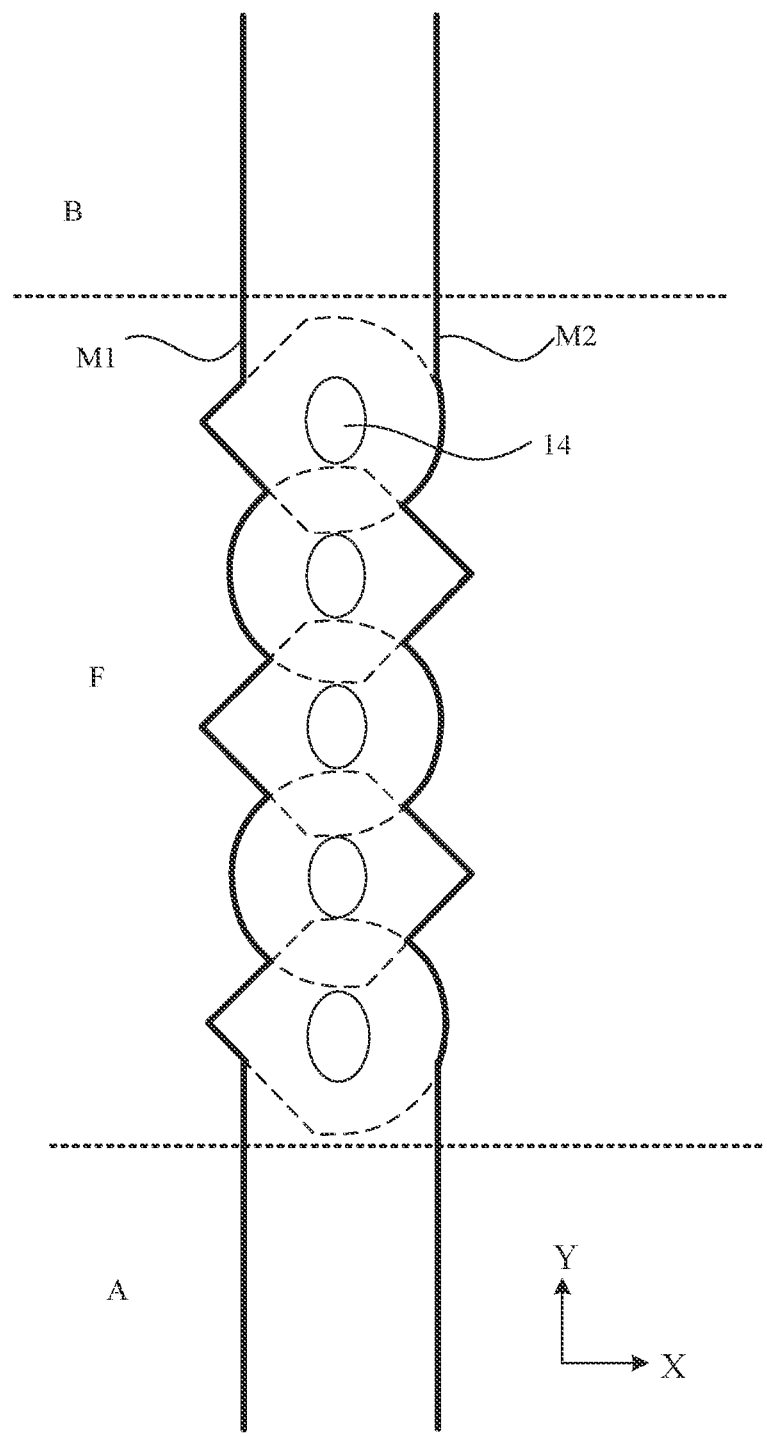
FIG. 8A is a structural diagram of a signal line, in accordance with some embodiments.
Figure 8B:
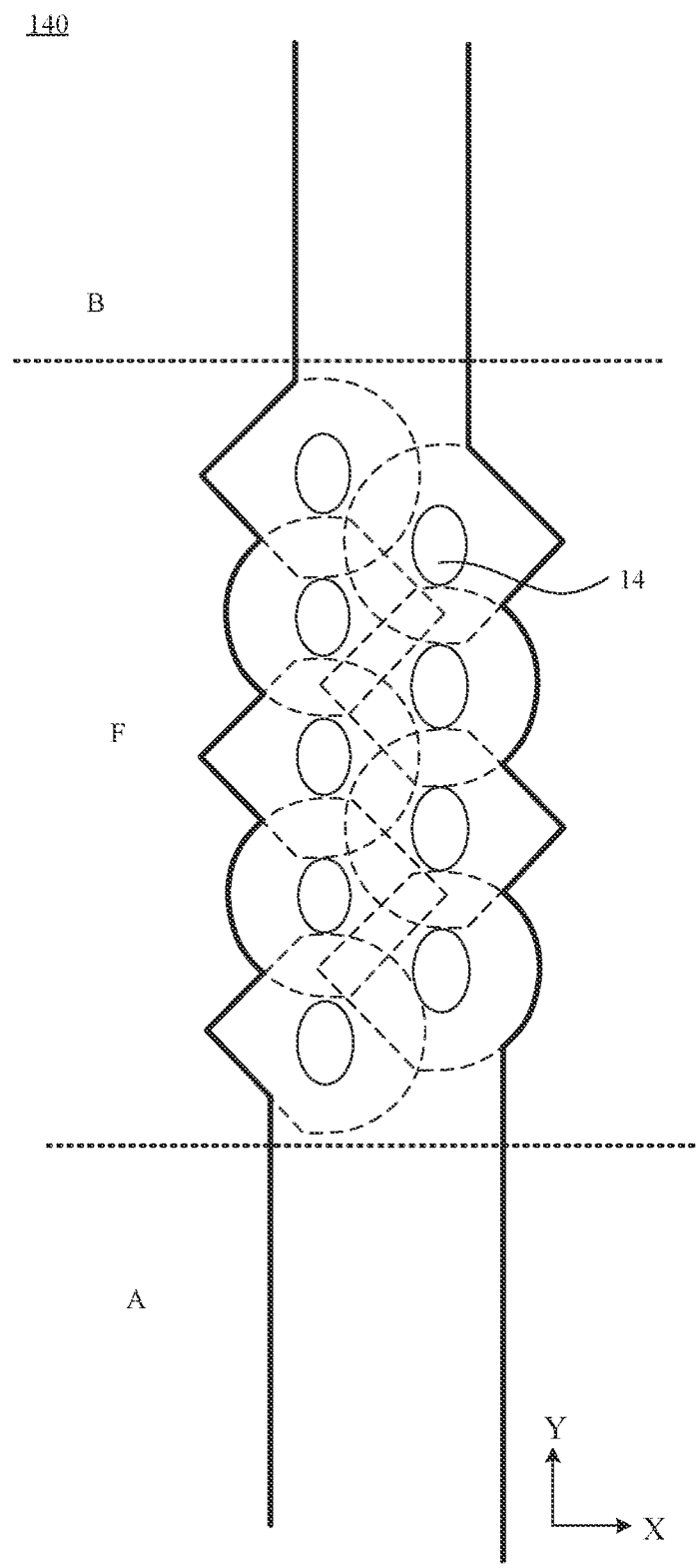
FIG. 8B is a structural diagram of another signal line, in accordance with some embodiments.

In some embodiments, as shown in FIGS. 8A and 8B, at least one signal line 140 has at least one opening 14, and the at least one opening 14 is located in the bending region F. In this way, stress to which the at least one signal line 140 is subjected during bending may be reduced, and the signal line 140 may be prevented from being broken in the bending region F during bending of the display panel 100.

For example, as shown in FIG. 8A, at a position where the opening 14 is located, the signal line 140 has a first edge M1 and a second edge M2, and the first edge M1 and the second edge M2 are opposite to each other along a width direction of the signal line 140 (e.g., the direction X in FIG. 8A). The first edge M1 and the second edge M2 each have broken line segments and arc line segments, and the broken line segments and the arc line segments of each edge are connected to each other. Along an extension direction of the signal line 140, the broken line segments and the arc line segments are alternately arranged in sequence. For example, along the width direction of the signal line 140, the broken line segments of the first edge M1 and the broken line segments of the second edge M2 are arranged in a staggered manner, and the arc line segments of the first edge M1 and the arc line segments of the second edge M2 are arranged in a staggered manner. For example, along the width direction of the signal line 140, the broken line segment of the first edge M1 is aligned with the arc line segment of the second edge M2, and the arc line segment of the first edge M1 is aligned with the broken line segment of the second edge M2.

It will be noted that, the opening may be designed according to actual situations, which is not limited herein. The specific number of openings is not limited. For example, there may be one, three or five openings. The arrangement of the openings is not limited either. For example, as shown in FIG. 8A, along the extension direction of the signal line 140 (e.g., the direction Y), a plurality of openings may be arranged in an aligned manner. That is, a connection line obtained by sequentially connecting geometric centers of the plurality of openings is a straight line. Alternatively, as shown in FIG. 8B, along the extension direction of the signal line 140 (e.g., the direction Y), the plurality of openings may be arranged in a staggered manner. That is, the connection line obtained by sequentially connecting the geometric centers of the plurality of openings is a broken line. The shape of the opening is not limited. For example, a planar shape of the opening (e.g., a shape of an orthogonal projection of the opening on the substrate) may be circular, elliptical, or quadrangular.

Figure 9A:
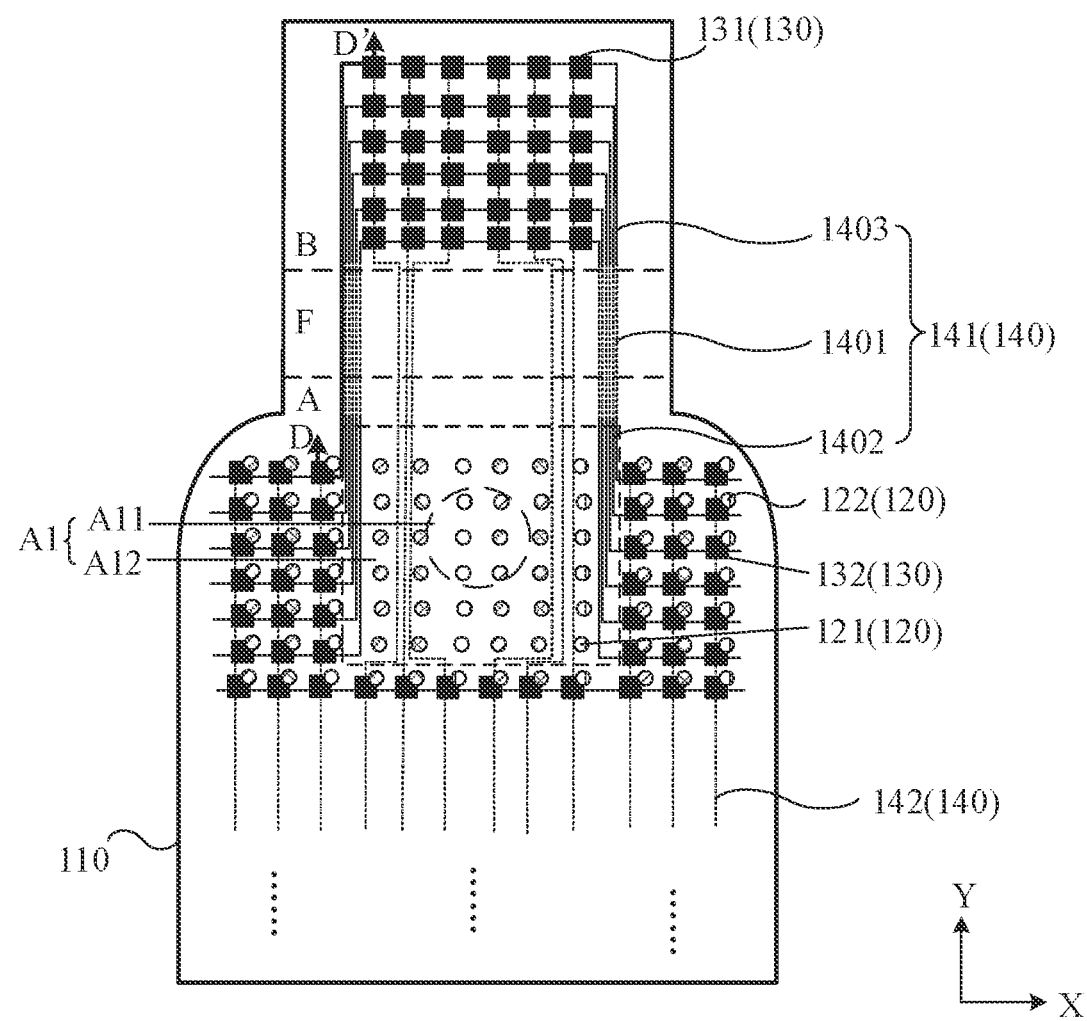
FIG. 9A is a structural diagram of yet another display panel, in accordance with some embodiments.
Figure 9B:
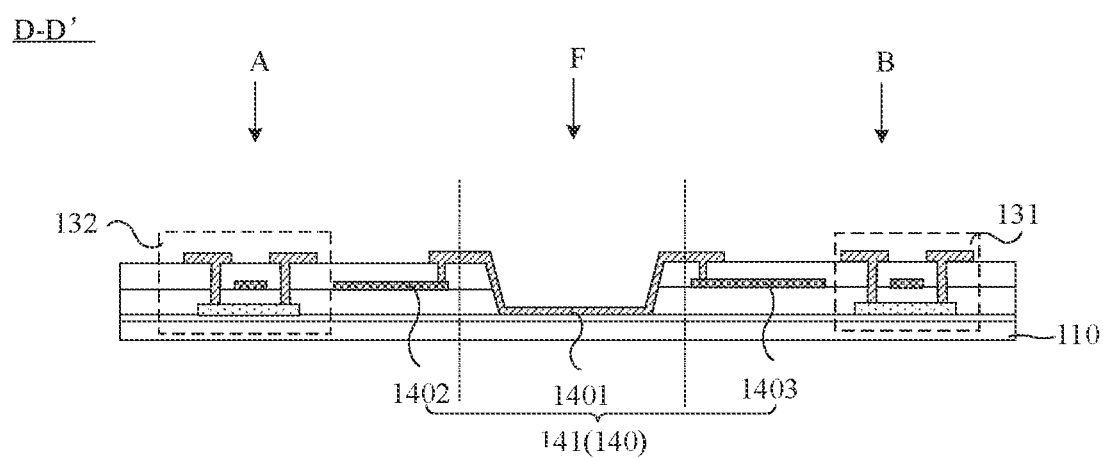
FIG. 9B is a sectional view of the display panel in FIG. 9A taken along the D-D' line.

In some embodiments, as shown in FIGS. 9A and 9B, at least one signal line 140 includes a first pattern 1401, a second pattern 1402 and a third pattern 1403. The first pattern 1401 is located in the bending region F, the second pattern 1402 is located in the first region A, and the third pattern 1403 is located in the second region B. The second pattern 1402 is coupled to second pixel circuit(s) 122 and the first pattern 1401, and the third pattern 1403 is coupled to first pixel circuit(s) 121 and the first pattern 1401. A tensile modulus of the first pattern 1401 is greater than a tensile modulus of the second pattern 1402 and a tensile modulus of the third pattern 1403, a ductility of the first pattern 1401 is greater than a ductility of the second pattern 1402 and a ductility of the third pattern, and a flexibility of the first pattern 1401 is greater than a flexibility of the second pattern 1402 and a flexibility of the third pattern 1403. In this case, during bending of the display panel 100, the signal line 140 may be prevented from being broken in the bending region F, thereby ensuring that the signal line 140 may work normally, prolonging a service life of the signal line 140, and improving performance of the display panel 100.

It will be noted that, the tensile modulus described herein refers to an elasticity of a pattern (e.g., the first pattern or the second pattern) during stretching. For example, the tensile modulus of the pattern (e.g., the first pattern or the second pattern) is a ratio of force required to stretch a unit length of the pattern along its central axis to a cross-sectional area of the pattern.

For example, the first pattern 1401 may extend beyond the bending region F to be coupled to the second pattern 1402 and the third pattern 1403. Orthogonal projections of the second pattern 1402 and the third pattern 1403 on the substrate 110 do not overlap the bending region F. For example, the first pattern 1401 and the second pattern 1402 are coupled through a via hole penetrating through a layer located between the first pattern 1401 and the second pattern 1402, and the first pattern 1401 and the third pattern 1403 are coupled through a via hole penetrating through a layer between the first pattern 1401 and the third pattern 1403. For example, the second pattern 1402 and the third pattern 1403 are arranged in a same layer and made of a same material. In this case, the second pattern 1402 and the third pattern 1403 may be synchronously formed. For example, the second pattern 1402 and the third pattern 1403 are formed by patterning a same film layer, thereby simplifying production processes and saving costs.

It will be noted that, for convenience of description, only one transistor in the pixel circuit in the figures (e.g., FIG. 9B, and the following FIGS. 10B to 10D and FIGS. 16A to 16C) is shown.

In some embodiments, as shown in FIG. 6, the plurality of signal lines 140 include first signal lines 141 and second signal lines 142. As shown in FIG. 9B, the first signal lines 141 each include a first pattern 1401, a second pattern 1402 and a third pattern 1403.

First patterns 1401 of the first signal lines 141 and the second signal lines 142 are made of a same material. For example, the first patterns 1401 and the second signal lines 142 are disposed in a same layer. In this case, the first patterns 1401 and the second signal lines 142 may be formed by patterning a same layer. That is, the first patterns 1401 and the second signal lines 142 may be synchronously formed, thereby simplifying production processes and saving costs.

For example, the first signal lines 141 may include gate lines, reset signal lines and light-emitting control signal lines. The gate lines are configured to transmit gate driving signals Gate, the reset signal lines are configured to transmit reset signals Reset, and the light-emitting control signal lines are configured to transmit light-emitting control signals EM. For example, a reset signal line coupled to pixel circuits in a current row may be used as a gate line coupled to pixel circuits in a next row. For example, the second pattern 1402 and the third pattern 1403 in the first signal line 141 are made of a same material. For example, the second pattern 1402 and the third pattern 1403 in the first signal line 141 may both be made of a metal including molybdenum (Mo).

The second signal lines 142 may include data lines, initial signal lines, first power supply signal lines and second power supply signal lines. The data lines are configured to transmit data signals Data. The initial signal lines are configured to transmit initial signals Initial. The first power supply signal lines are configured to transmit first power supply signals VDD. For example, the first power supply signals are a direct current (DC) high level signal. The second power supply signal lines are configured to transmit second power supply signals VSS. For example, the second power supply signals are a DC low level signal. For example, the second signal lines 142 may be made of metals including titanium (Ti) and Al. For example, the second signal lines 142 may have a triple-layer structure (Ti—Al—Ti), i.e., the triple-layer structure composed of two titanium material layers and an aluminum material layer sandwiched between the two titanium material layers. For example, the first patterns 1401 and the second signal lines 142 are made of a same material, and have a same structure. For example, the first patterns 1401 may be made of metals including Ti and Al, and the first patterns 1401 may also have the triple-layer structure (Ti—Al—Ti).

Figure 10A:
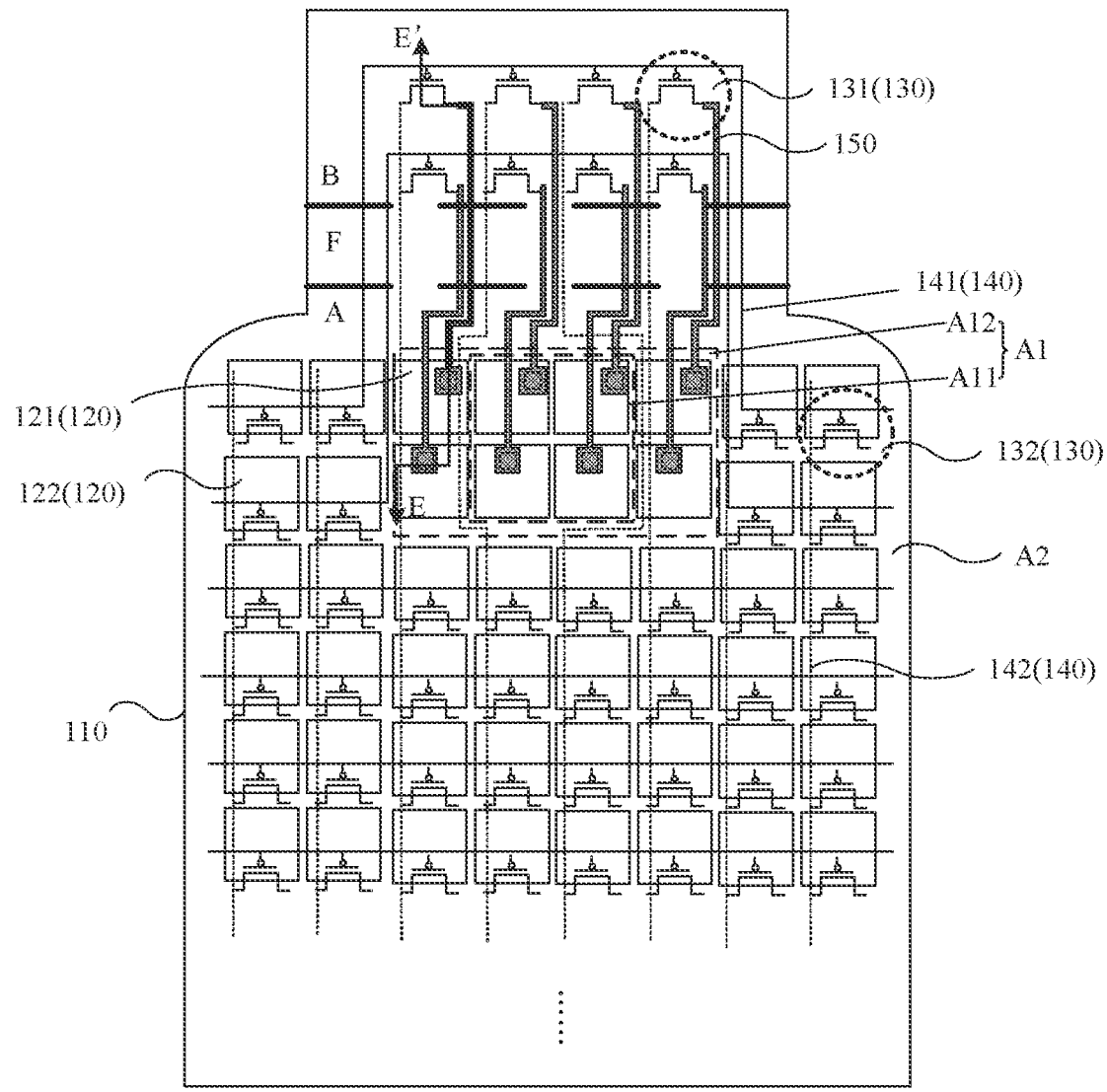
FIG. 10A is a structural diagram of yet another display panel, in accordance with some embodiments.
Figure 10B:
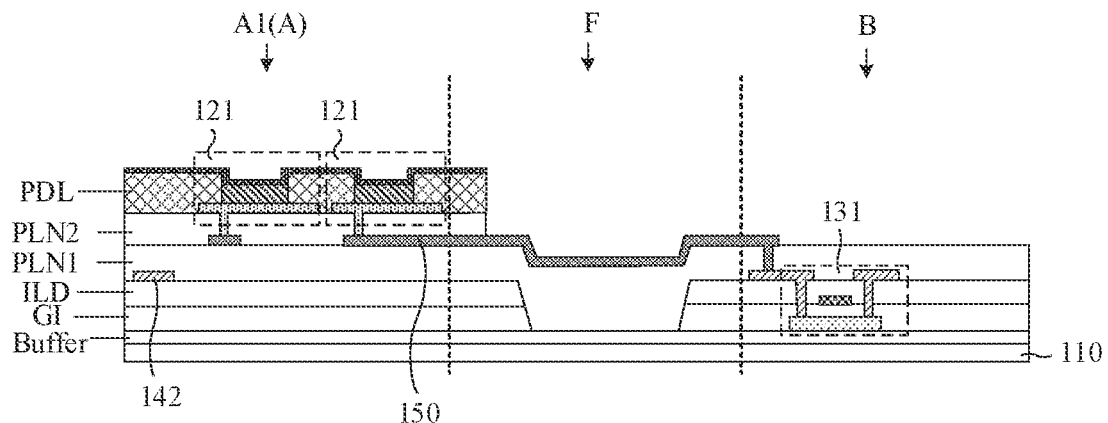
FIG. 10B is a sectional view of the display panel in FIG. 10A taken along the E-E' line.

In some embodiments, as shown in FIGS. 10A and 10B, the display panel 100 further includes a plurality of connection leads 150. The plurality of connection leads 150 are disposed on the substrate 110. A first light-emitting device 121 is coupled to a first pixel circuit 131 through a connection lead 150. It can be understood that, the first pixel circuit 131 transmits a driving signal (e.g., a driving current) to the first light-emitting device 121 through the connection lead 150, so as to drive the first light-emitting device 121 to operate. The first light-emitting device 121 emits light in response to the driving signal transmitted by the connection lead 150. For example, the drain of the driving transistor in the first pixel circuit is connected to the anode of the light-emitting device through the connection lead.

In addition, the first patterns 1401 and the second signal lines 142 may be arranged in different layers. For example, the first patterns 1401 are closer to the substrate 110 than the second signal lines 142. In this way, wiring space may be enlarged, and the first patterns 1401 and the second signal lines 142 may be prevented from intersecting each other.

A portion of at least one connection lead 150 located in at least the first display region A1 is transparent. In this way, it may be possible to prevent the connection lead 150 from affecting the transmittance of the first display region A1. For example, the at least one connection lead 150 may be entirely transparent. For example, the transparent portion of the at least one connection lead 150 may be made of a transparent conductive material. For example, the transparent conductive material may be an oxide including ITO, IZO or AZO, or may be a thin transparent metal including Ag, or may be a combination of an oxide and a metal including ITO and Ag.

The transparent structure described herein means that the structure has a high transmittance to light. For example, the transmittance may be greater than or equal to approximately 80%. The structure may be colored or colorless.

It will be noted that, wiring of the plurality of connection leads 150 may be designed according to actual situations of the display panel 100. For example, the wiring of the plurality of connection leads 150 may be designed considering factors such as a size of the wiring space of the display panel 100, positions of the first pixel circuits 131 and positions of the first light-emitting devices 121, which is not limited herein. For example, in the bending region F, a distance between two adjacent connection leads 150 is smaller than a distance between two adjacent light-emitting devices 120. For example, in order to prevent the plurality of connection leads 150 from intersecting each other, the connection leads 150 may pass through the second display region A2. That is, orthogonal projections of the connection leads 150 on the substrate 110 may overlap the second display region A2.

For example, the plurality of connection leads may be arranged in a same layer. That is, the plurality of connection leads 150 may be synchronously formed (e.g., being formed by patterning a same layer), thereby simplifying production processes and saving costs. For example, the plurality of connection leads may be disposed in a plurality of layers, so that the connection leads may be prevented from intersecting each other.

Figure 10C:
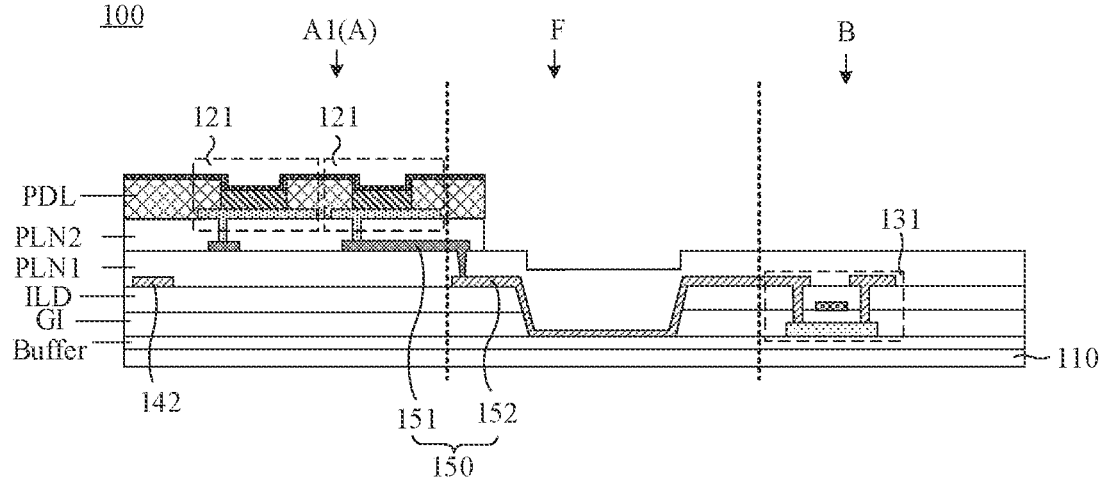
FIG. 10C is a structural diagram of yet another display panel, in accordance with some embodiments.

In some embodiments, as shown in FIG. 10C, at least one connection lead 150 includes a fourth pattern 151 and a fifth pattern 152. The fourth pattern 151 is located in the first display region A1, and the fifth pattern 152 is located outside the first display region A1. The fourth pattern 151 is coupled to a first light-emitting device 121. The fifth pattern 152 is coupled to the fourth pattern 151 and a first pixel circuit 131.

An orthogonal projection of the fifth pattern 152 on the substrate 110 does not overlap the first display region A1, and overlaps the bending region F and the second region B. In a case where the first display region A1 includes the first sub-region A11 and the second sub-region A12, the orthogonal projection of the fifth pattern 152 on the substrate 110 does not overlap the first sub-region A11, and overlaps the second sub-region A12, and an orthogonal projection of the fourth pattern 151 on the substrate 110 overlaps the first sub-region A11.

Figure 10D:
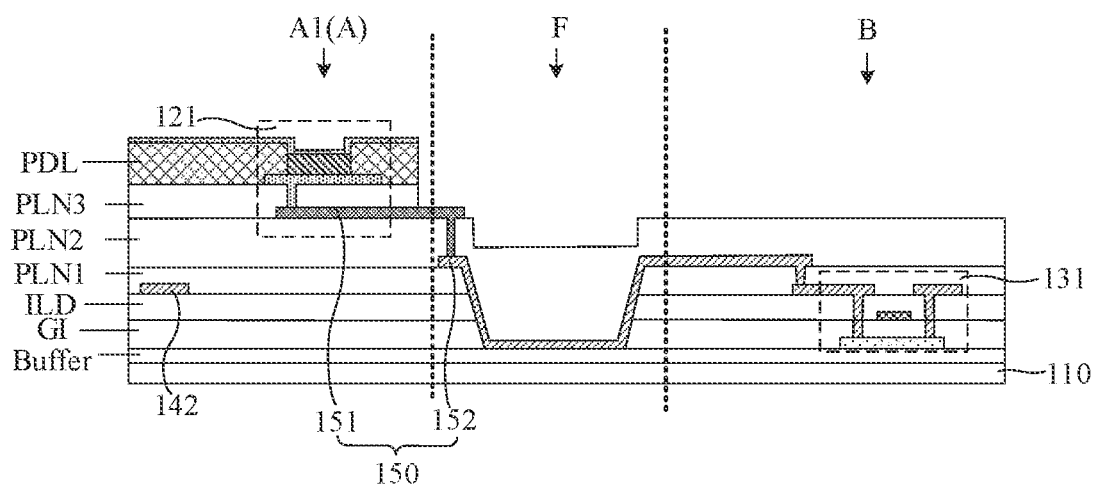
FIG. 10D is a structural diagram of yet another display panel, in accordance with some embodiments.

For example, in a case where the at least one signal line 140 includes a second signal line 142, the fifth pattern 152 and the second signal line 142 are made of a same material. For example, in a case of ensuring that the fifth pattern 152 does not intersect the second signal line 142, the fifth pattern 152 and the second signal line 142 may be arranged in a same layer (as shown in FIG. 10C). Alternatively, for example, the fifth pattern 152 and the second signal line 142 are located in different pattern layers. For example, as shown in FIG. 10D, the fifth pattern 152 is farther away from the substrate 110 than the second signal line 142, the fifth pattern 152 is closer to the substrate 110 than the fourth pattern 151, and the fourth pattern 151 and the fifth pattern 152 may be connected through a via hole penetrating through a layer located between the fourth pattern 151 and the fifth pattern 152. For example, a material of the fifth pattern 152 includes metal such as Ti or Al. For example, the fifth pattern 152 may have a triple-layer structure of Ti—Al—Ti. For example, the fourth pattern is made of a transparent conductive material including ITO or IZO. In this way, a ductility of the fifth pattern 152 is higher than that of the fourth pattern 151, a tensile modulus of the fifth pattern 152 is greater than that of the fourth pattern 151, and a flexibility of the fifth pattern 152 is greater than that of the fourth pattern 151. Consequently, the connection lead 150 may be prevented from being broken in the bending region F. In addition, a resistance of the fifth pattern 152 is smaller than that of the fourth pattern 151, so that a resistance of the connection lead 150 may be reduced, and loss of an electrical signal transmitted by the connection lead 150 may be avoided.

For example, the fourth pattern 151 has a single-layer structure, and the fifth pattern 152 includes three sub-patterns. A second sub-pattern in the three sub-patterns is located between a first sub-pattern and a third sub-pattern, and the third sub-pattern is farther away from the substrate than the first sub-pattern. The first sub-pattern and the fourth pattern are arranged in a same layer and made of a same material, and the third sub-pattern and the first sub-pattern are made of a same material. For example, the fourth pattern, the first sub-pattern and the third sub-pattern are all made of a transparent conductive material including ITO or IZO, and the second sub-pattern is made of a metal material including Ag or Al. For example, the first sub-pattern and the third sub-pattern are made of ITO, and the second sub-pattern is made of Ag. In this case, the fifth pattern has a triple-layer structure of ITO-Ag-ITO. The fourth pattern and the first sub-pattern in the fifth pattern are synchronously formed, and are connected to form a one-piece structure. For example, the first sub-pattern in the fifth pattern is served as the fourth pattern. In terms of process, for example, three conductive films, such as an ITO film, an Ag film and another ITO film that are sequentially stacked, may be formed on the substrate; then, the three conductive films are patterned to remain portions of a first conductive film of the three conductive films located in regions where the fourth pattern and the fifth pattern region are to be formed, and portions of a third conductive film and a second conductive film of the three conductive films located in a region where the fifth pattern region is to be formed, so that the fifth pattern and the fourth pattern are obtained.

It can be understood that, the fourth pattern 151 is transparent, so that the transmittance of the first display region A1 may be improved. In addition, the ductility of the fifth pattern 152 is higher than that of the fourth pattern 151, the tensile modulus of the fifth pattern 152 is greater than that of the fourth pattern 151, and the flexibility of the fifth pattern 152 is greater than that of the fourth pattern 151, so that the connection lead 150 may be prevented from being broken in the bending region F.

For example, the fifth pattern 152 and the anode 1201 of the light-emitting device 120 are made of a same material. For example, the anode 1201 of the light-emitting device 120 may also have the triple-layer structure of ITO-Ag-ITO. In this way, in a process of fabricating the fifth pattern 152 and the anode 1201, a same material, e.g., a same target material, may be used in a film forming process. Thus, production costs may be reduced.

It will be noted that, for convenience of description, only one transistor in the first pixel circuit 131 in FIGS. 10A to 10D is shown.

For example, the display panel further includes a first conductive layer and a second conductive layer, and the first conductive layer is located on a side of the second conductive layer proximate to the substrate. The first pattern is located in the first conductive layer, the fifth pattern is located in the second conductive layer, and the second signal line may be located in the first conductive layer or the second conductive layer. In this way, the wires may be prevented from intersecting each other. For example, the first pattern, the fifth pattern and the second signal line are all made of the same material.

In addition, the display panel further includes a third conductive layer and a fourth conductive layer, and the fourth conductive layer is located on a side of the third conductive layer proximate to the substrate. The control electrode of each transistor in the pixel circuit may be located in the fourth conductive layer, a first electrode of the capacitor may be located in the fourth conductive layer, and a second electrode of the capacitor may be located in the third conductive layer. The second pattern and the third pattern of the first signal line may be located in the fourth conductive layer or the third conductive layer. For example, the first electrode and the second electrode of the capacitor, the control electrode of each transistor in the pixel circuit, and the second pattern and the third pattern of the first signal line are all made of the same material.

For example, the plurality of signal lines further include third signal lines and fourth signal lines that are located in the second display region, and the third signal lines and the fourth signal lines are coupled to the second pixel circuits. The third signal lines and the second patterns and the third patterns of the first signal lines are made of the same material and arranged in the same layer, and the fourth signal lines and the second signal lines are made of the same material and arranged in the same layer.

Figure 11:
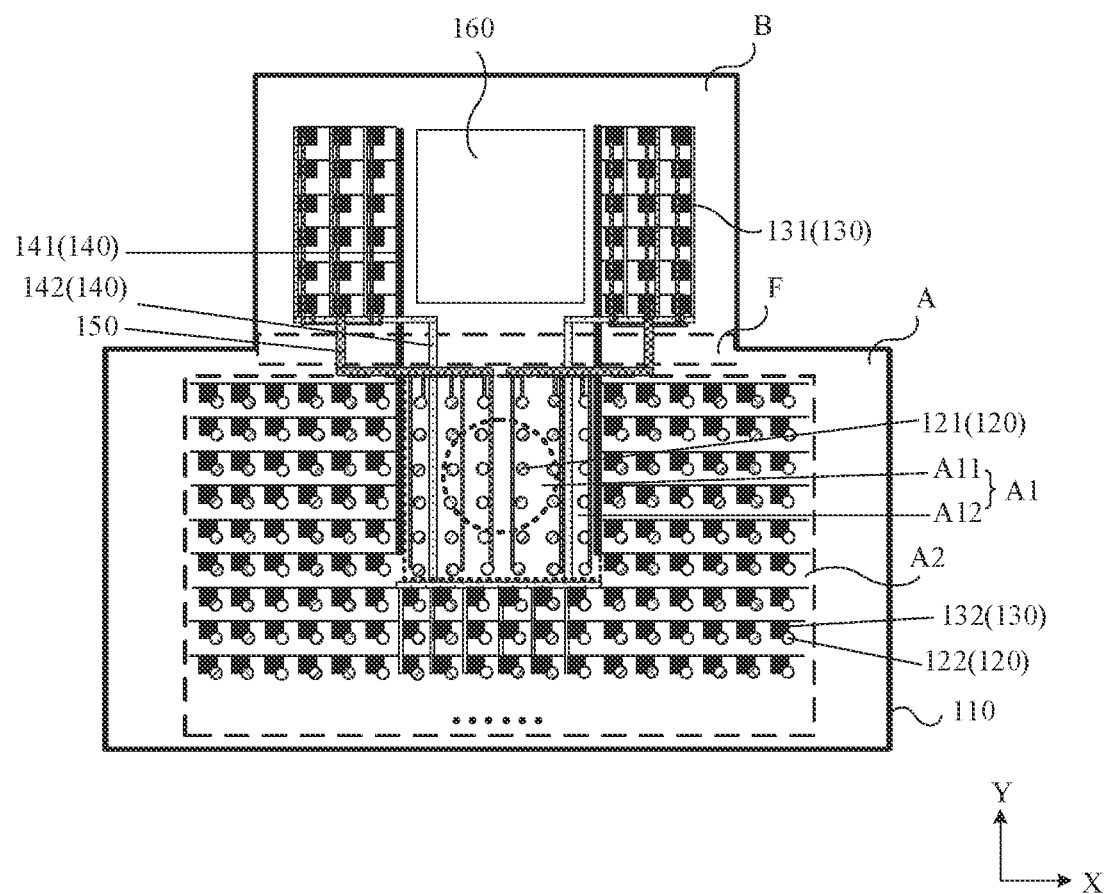
FIG. 11 is a structural diagram of yet another display panel, in accordance with some embodiments.

In some embodiments, as shown in FIG. 11, the portion of the display panel 100 located in the second region B includes a transparent portion 160. Orthogonal projections of the first pixel circuits 131 on the substrate 110 do not overlap the transparent portion 160. For example, there is no non-transparent film layer in the transparent portion 160. For example, the non-transparent film layer includes a metal layer and a semiconductor layer. For example, the transparent portion 160 includes a transparent layer on the substrate 110, such as an insulating layer. For example, referring to FIGS. 10B to 10D, the insulating layer may include a buffer layer Buffer, a gate insulating layer GI, an interlayer dielectric layer ILD, or a planarization layer PLN. For example, a plurality of planarization layers (PLN1, PLN2 and PLN3) may be provided.

In a case where the portion of the display panel 100 located in the second region B is bent onto the back of the portion of the display panel 100 located in the first region A, and the first display region A1 includes the first sub-region A11, the first sub-region A11 is located within a region where an orthogonal projection of the transparent portion 160 on the portion of the substrate 110 located in the first region A is located.

In this case, the portion of the display panel 100 located in the second region B is bent onto the back of the portion of the display panel 100 located in the first region A, and the light is not blocked by the first pixel circuits 131 when passing through the first sub-region A11 and the transparent portion 160, so that the transmittance may be improved. Therefore, in a case where the sensor is located in the first sub-region A11, the ability of the sensor to sense light may be improved, and the sensing effect may be improved.

For example, in a case where the portion of the display panel 100 located in the second region B is bent onto the back of the portion of the display panel 100 located in the first region A, the first display region A1 is located within the region where the orthogonal projection of the transparent portion 160 on the portion of the substrate 110 located in the first region A is located. In this way, light is not blocked by the first pixel circuits 131 when passing through the first display region A1, so that the transmittance may be improved.

For example, in the second region B, an orthogonal projection of at least one signal line 140 (e.g., a first signal line 141) on the substrate 110 does not overlap an orthogonal projection of the transparent portion 160 on the substrate 110. For example, in a case where there are a plurality of first pixel circuits 131, the plurality of first pixel circuits 131 may be located on two opposite sides of the transparent portion 160 along a row direction (e.g., the direction X in FIG. 11) in which the pixel circuits are arranged. For example, first pixel circuits coupled to a row of first light-emitting devices are divided into two parts, in which one part of the first pixel circuits are located on one of the two opposite sides, and the other part of the first pixel circuits are located on the other of the two opposite sides. The two parts of the first pixel circuits are coupled to two first signal lines, respectively. The two first signal lines transmit synchronous signals, and the two first signal lines are respectively located on the two opposite sides. One part of the two parts of the first pixel circuits is coupled to one of the two first signal lines, and the other part of the two parts of the first pixel circuits is coupled to the other of the two first signal lines.

It will be noted that, the row direction in which the pixel circuits are arranged described herein may be a direction in which pixel circuits responding to synchronous signals are arranged. For example, in response to synchronous gate driving signals, pixel circuits into which data signals are synchronously written are a row of pixel circuits.

Figure 12A:
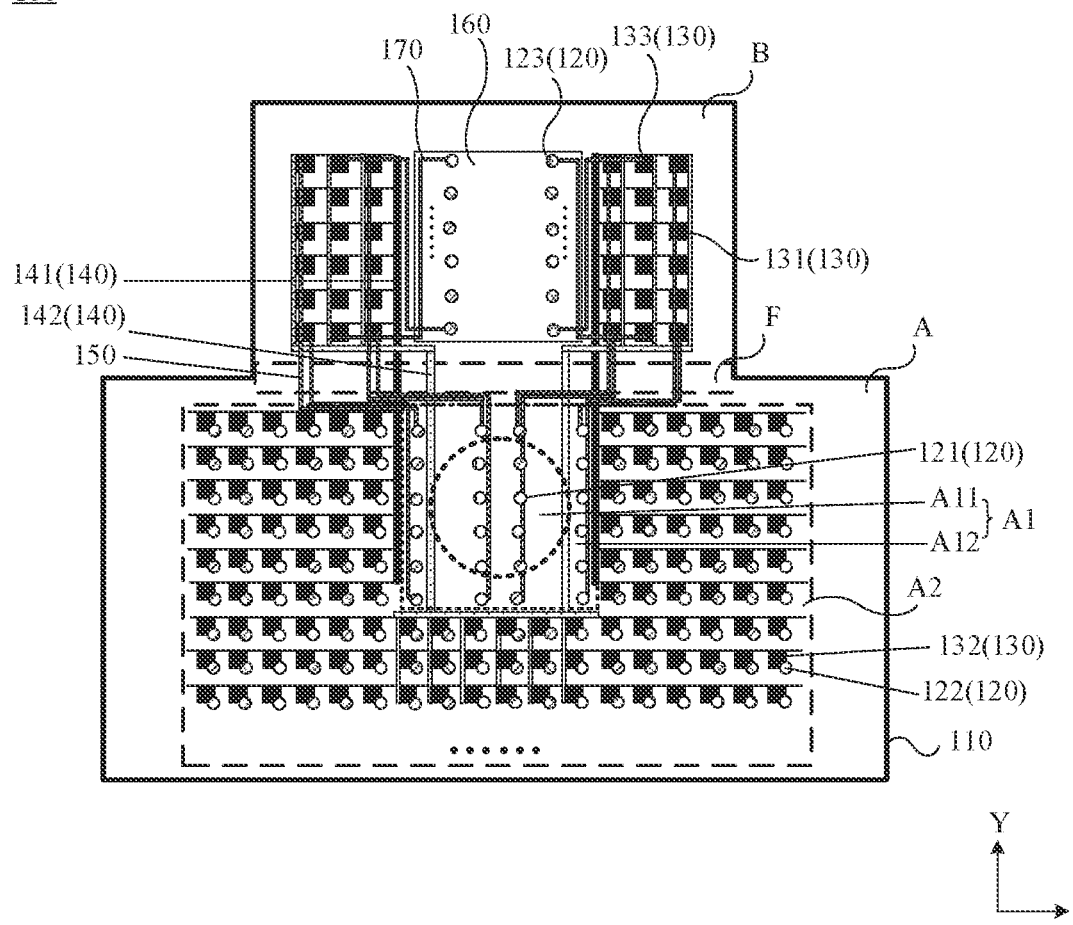
FIG. 12A is a structural diagram of yet another display panel, in accordance with some embodiments.
Figure 12B:
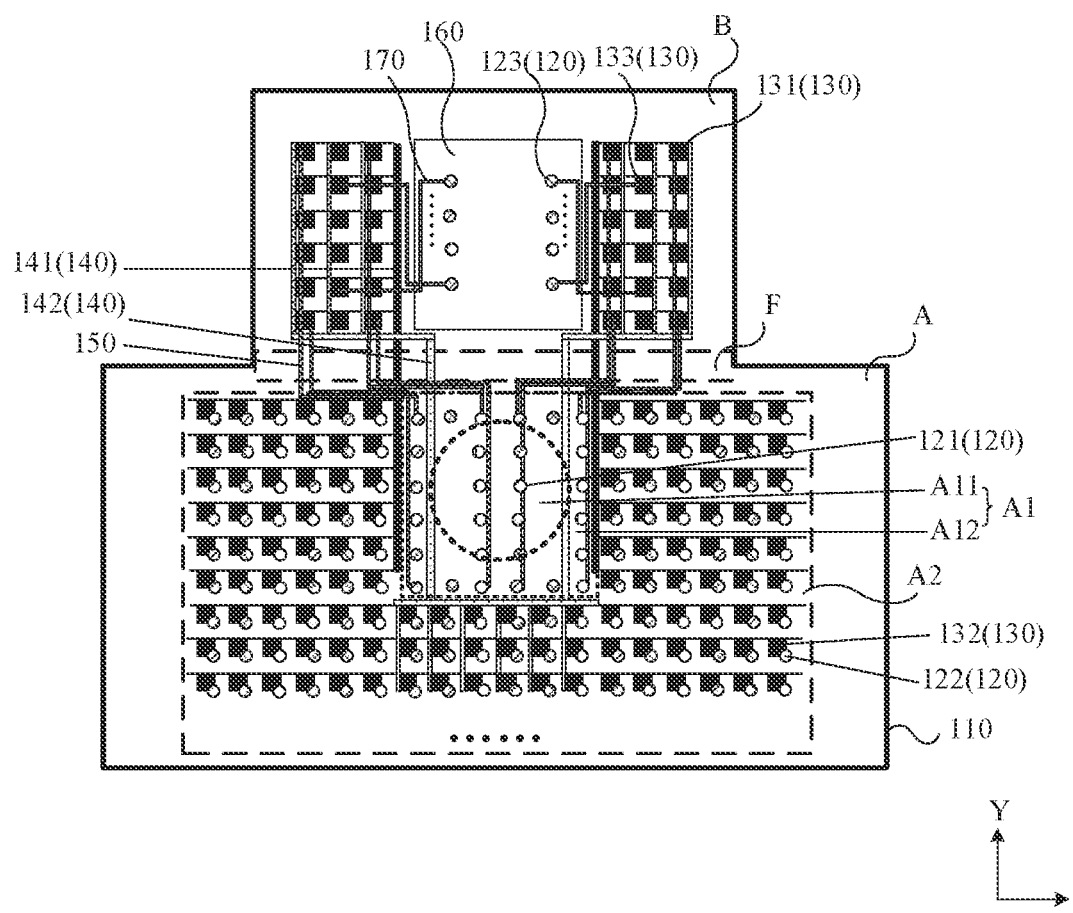
FIG. 12B is a structural diagram of yet another display panel, in accordance with some embodiments.
Figure 13A:
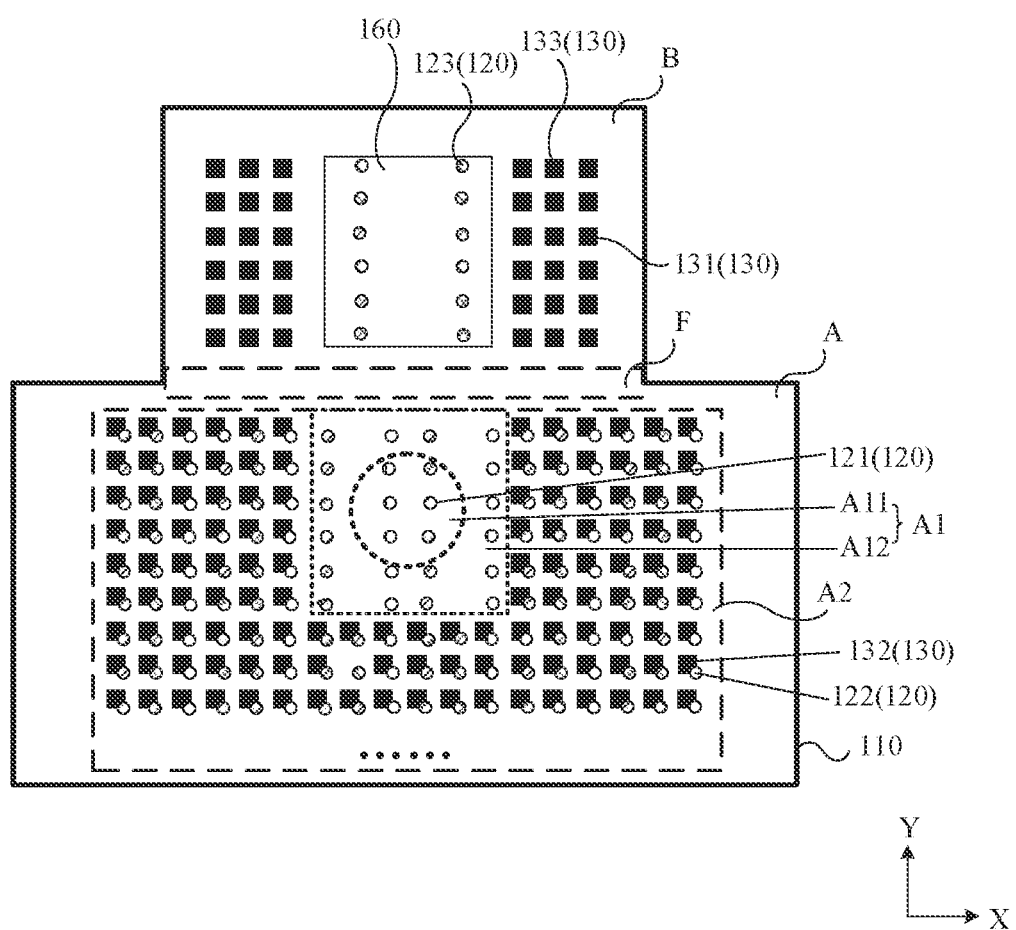
FIG. 13A is a structural diagram of yet another display panel, in accordance with some embodiments.

In some embodiments, as shown in FIGS. 12A, 12B and 13A, the plurality of light-emitting devices 120 further includes third light-emitting devices 123. The third light-emitting devices 123 are located on the transparent portion 160. The plurality of pixel circuits 130 further include third pixel circuits 133. The third pixel circuits 133 are located in the second region B. The third pixel circuits 133 are coupled to the third light-emitting devices 123. Orthogonal projections of the third pixel circuits 133 on the substrate 110 do not overlap the orthogonal projection of the transparent portion 160 on the substrate 110.

It can be understood that, the third pixel circuits 133 do not block the light passing through the transparent portion 160. That is, the third pixel circuits 133 do not block the light passing through the first sub-region A11, so that the transmittance of the first sub-region A11 may be improved. In addition, the third pixel circuits 133 do not block the light passing through the first display region A1, so that the transmittance of the first display region A1 may be improved.

In a case where the portion of the display panel 100 located in the second region B is bent onto the back of the portion of the display panel 100 located in the first region A, orthogonal projections of the third light-emitting devices 123 on the portion of the substrate 110 located in the first region A are located within the first display region A1, and do not overlap orthogonal projections of the first light-emitting devices 121 on the substrate 110.

For example, in a case where the first display region A1 includes the first sub-region A11, the orthogonal projections of the third light-emitting device 123 on the portion of the substrate 110 located in the first region A are located within the first sub-region A11, and do not overlap the orthogonal projections of the first light-emitting devices 121 on the substrate 110.

For example, the third pixel circuits 133 are coupled to multiple signal lines 140. For example, in a case where the orthogonal projections of the third light-emitting devices 123 on the portion of the substrate 110 located in the first region A, and the orthogonal projections of the first light-emitting devices 121 on the substrate 110, are located within a region where an orthogonal projection of a row of light-emitting devices on the substrate 110 is located, the first pixel circuits 131 and the third pixel circuits 133 are coupled to a signal line 140 (e.g., a first signal line 141). For example, in a case where the orthogonal projections of the third light-emitting devices 123 on the portion of the substrate 110 located in the first region A, and the orthogonal projections of the first light-emitting devices 121 on the substrate 110, are located within a region where an orthogonal projection of a column of light-emitting devices on the substrate 110 is located, the first pixel circuits 131 and the third pixel circuits 133 are coupled to a signal line 140 (e.g., a second signal line 142).

In this case, since a part of light-emitting devices normally located in the first display region A1 are arranged in the second region B, that is, the third light-emitting devices 123 are arranged in the second region B, the corresponding pixel circuits are also located in the second region B, so that connection lines between the third light-emitting devices 123 and the third pixel circuits 133 may not pass through the first display region A1 and the bending region F. Consequently, the number of wires in the first display region A1 and the number of wires in the bending region F may be reduced, the wiring is simplified, and the difficulty of wiring is reduced.

Figure 13B:
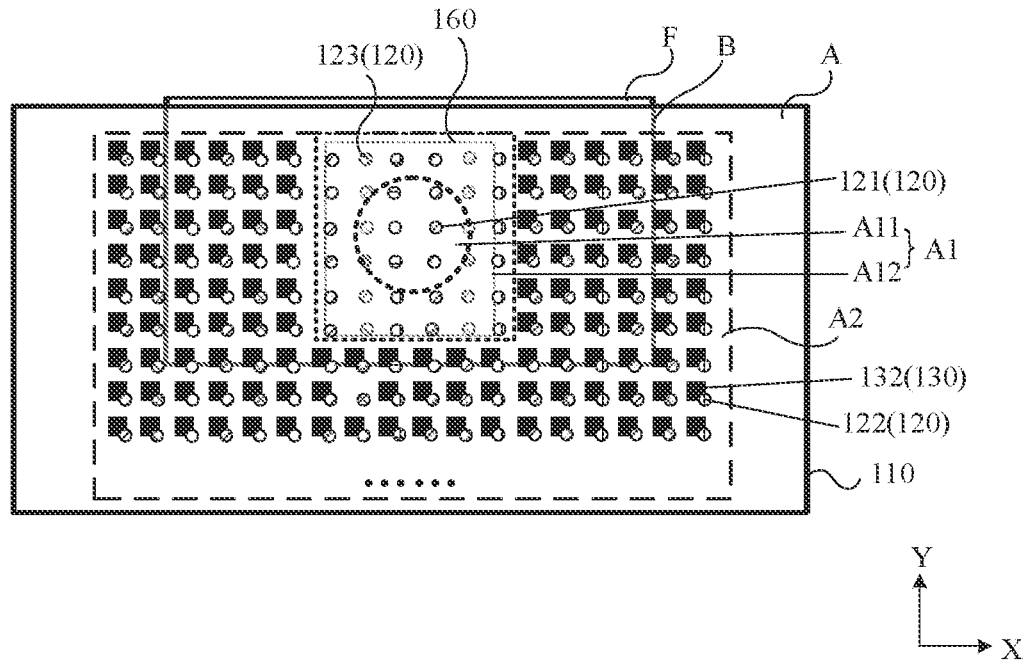
FIG. 13B is a structural diagram of the display panel in FIG. 13A after being bent.

In some embodiments, in a case where the portion of the display panel 100 located in the second region B is bent onto the back of the portion of the display panel 100 located in the first region A, as shown in FIG. 13B, an arrangement of the first light-emitting devices 121 and the third light-emitting devices 123 as a whole is same as an arrangement of the second light-emitting devices 122.

In a case where the portion of the display panel 100 located in the second region B is bent onto the back of the portion of the display panel 100 located in the first region A, an arrangement of the orthogonal projections of the first light-emitting devices 121 and the third light-emitting devices 123 on the portion of the substrate 110 located in the first region A is same as an arrangement of orthogonal projections of the second light-emitting devices 122 on the substrate 110, and the arrangement of the orthogonal projections of the first light-emitting devices 121, the second light-emitting devices 122 and the third light-emitting devices 123 satisfies the arrangement of the plurality of light-emitting devices 120 in the display panel 100.

For example, as shown in FIG. 13A, the second light-emitting devices 122 are arranged in an array. As shown in FIG. 13B, in a case where the portion of the display panel 100 located in the second region B is bent onto the back of the portion located of the display panel 100 in the first region A, the first light-emitting devices 121 and the third light-emitting devices 123 are arranged in an array as a whole.

For example, along a column direction (referring to the direction Y in FIG. 13A) in which the pixel circuits are arranged, there are n third light-emitting devices in a column. In a case where the portion of the display panel 100 located in the second region B is bent onto the back of the portion of the display panel 100 located in the first region A, in orthogonal projections of the third light-emitting devices in the column on the portion of the substrate 110 located in the first region A, an orthogonal projection of an i-th third light-emitting device is in an (n+1−i)-th row of the orthogonal projections of the n third light-emitting devices; n is a positive integer, and i is less than or equal to n (i≤n), and i is a positive integer. For example, there are six third light-emitting devices in a column (i.e., n is equal to 6 (n=6)); and for a first third light-emitting device (i.e., i is equal to 1 (i=1)) when the display panel 100 is in a flat state (referring to FIG. 13A), in a case where the portion of the display panel 100 located in the second region B is bent onto the back of the portion of the display panel 100 located in the first region A (referring to FIG. 13B), an orthogonal projection of the first third light-emitting device on the portion of the substrate 110 located in the first region A is in a sixth row of orthogonal projections of the six third light-emitting devices in the column.

For example, in a case where the portion of the display panel 100 located in the second region B is bent onto the back of the portion of the display panel 100 located in the first region A, an orthogonal projection of a third light-emitting device on the portion of the substrate located in the first region is in a same row as an orthogonal projection of a first light-emitting device on the substrate, and a third pixel circuit coupled to the third light-emitting device is in a same row as a first pixel circuit coupled to the first light-emitting device. For example, there are six third light-emitting devices in a column, and correspondingly, there are also six third pixel circuits in a column; and a third light-emitting device in a first row is coupled to a third pixel circuit in a sixth row. For example, in a case where the portion of the display panel 100 located in the second region B is bent onto the back of the portion of the display panel 100 located in the first region A (referring to FIG. 13B), orthogonal projections of third light-emitting devices on the portion of the substrate located in the first region and orthogonal projections of first light-emitting devices on the substrate are arranged in an array of six rows and six columns (referring to FIG. 13B); orthogonal projections of third light-emitting devices in a first row on the portion of the substrate 110 located in the first region A and orthogonal projections of first light-emitting devices in the sixth row on the substrate 110 are located in a same row (i.e., a sixth row). In this case, third pixel circuits coupled to the third light-emitting devices in the first row and first pixel circuits coupled to the first light-emitting devices in the sixth row are located in a same row (e.g., a sixth row), and the third pixel circuits and the first pixel circuits in the same row respond to synchronous signals (e.g., synchronous gate driving signals).

It will be noted that, the embodiments of the present disclosure do not limit an arrangement of the light-emitting devices, which may be designed according to actual situations. For example, the plurality of light-emitting devices may be arranged in an array; or, the plurality of light-emitting devices may be arranged in a Pentile matrix. For example, in a case where the light-emitting devices are arranged in an array, light-emitting devices in two adjacent rows and light-emitting devices in two adjacent columns may be arranged in an aligned manner, or light-emitting devices in two adjacent rows and light-emitting devices in two adjacent columns may be arranged in a staggered manner, which is not limited in the embodiments of the present disclosure.

In some embodiments, the number of the third light-emitting devices 123 is smaller than that of the first light-emitting devices 121. It can be understood that, in a case where the portion of the display panel 100 located in the second region B is bent onto the back of the portion of the display panel 100 located in the first region A, light emitted by the third light-emitting devices 123 is directed toward a side of the first light-emitting devices 121 away from the substrate 110 via a portion of the substrate 110 located in the first display region A, light emitted by the first light-emitting devices 121 is directed toward the side of the first light-emitting devices 121 away from the substrate 110, and light emitted by the second light-emitting devices 122 is directed toward a side of the second light-emitting devices 122 away from the substrate 110. In this case, the light emitted by the third light-emitting devices 123 passes through layers located on a side of the first light-emitting devices 121 proximate to the substrate and layers located on a side of the second light-emitting devices 122 proximate to the substrate. Therefore, the number of the layers through which the light emitted by the third light-emitting devices 123 passes is greater than the number of layers through which the light emitted by the first light-emitting devices 121 passes and the number of layers through which the light emitted by the second light-emitting devices 122 passes. As a result, light-emitting effect of the third light-emitting devices 123 is lower than light-emitting effect of the first light-emitting devices 121 and light-emitting effect of the second light-emitting devices 122. In light of this, the number of the third light-emitting devices 123 is set to be smaller than the number of the first light-emitting devices 121, which may be possible to reduce influence of the light-emitting effect of the third light-emitting devices 123 on the display panel 100, and avoid non-uniform light emission in the first display region A1 and the second display region A2 after the display panel 100 is bent, thereby ensuring that the display effects in the first display region A1 and the second display region A2 are uniform, and ensuring display uniformity of the display panel 100.

In some embodiments, as shown in FIGS. 12A and 12B, the display panel 100 further includes transparent conductive lines 170. The transparent conductive lines 170 are disposed on the substrate 110. The third light-emitting devices 123 are coupled to the third pixel circuits 133 through the transparent conductive lines 170. In this way, in a case where the portion of the display panel 100 located in the second region B is bent onto the back of the portion of the display panel 100 located in the first region A, it may be possible to improve the transmittance of the first display region A1.

For example, the transparent conductive lines 170 are made of a transparent conductive material including ITO. In a case where the connection lead(s) 150 each include the fourth pattern 151, the transparent conductive lines 170 and the fourth pattern(s) 151 are arranged in a same layer and made of a same material. That is, the transparent conductive lines 170 and the fourth pattern(s) 151 may be synchronously formed. For example, the transparent conductive lines 170 and the fourth pattern(s) 151 may be formed by patterning a same layer, thereby simplifying manufacturing processes and saving costs.

It will be noted that, according to actual situations, the plurality of transparent conductive lines may be routed in a single layer, or may be routed in a plurality of layers, which is not limited in the present disclosure.

In some embodiments, the transparent portion 160 is an opening, and a depth direction of the opening is perpendicular to a plane where a portion of the substrate 110 located in the second region B is located. Along a thickness direction of the portion of the substrate 110 located in the second region B, the opening penetrates the substrate 110. That is, a portion of the display panel 100 in a region where the transparent portion 160 is located is a through hole. For example, in terms of process, layers (e.g., a metal layer, a semiconductor layer, an inorganic material layer, and an organic material layer) and a portion of the substrate 110 (e.g., the substrate 110 includes PI) that are located in the region where the transparent portion 160 is located may be removed through a laser cutting process, which is similar to an active area hole (AAH) process (i.e., a process of forming a hole in an active area (AA) with laser), so as to obtain the opening. In this way, light transmittance of the display panel may be improved, and in a case where the portion of the display panel 100 located in the second region B is bent onto the back of the portion of the display panel 100 located in the first region A, the number of layers through which light passes may be reduced, thereby improving the under-screen sensing effect of the display panel 100.

In some embodiments, referring to FIGS. 11, 12A and 12B, the pixel circuits 130 located in the second region B are arranged in an array. The pixel circuits 130 are located on at least one of the two opposite sides of the transparent portion 160 along the row direction (e.g., the direction X shown in FIG. 11) in which the pixel circuits are arranged. In this way, the pixel circuits in the second region B may be evenly distributed, and correspondingly, wires coupled to the pixel circuits may also be evenly distributed. For example, along the row direction in which the pixel circuits are arranged, the pixel circuits 130 are located on one of the two opposite sides of the transparent portion 160; or, along the row direction in which the pixel circuits are arranged, a part of the pixel circuits 130 is located on one of the two opposite sides of the transparent portion 160, and another part thereof is located on the other of the two opposite sides of the transparent portion 160.

For example, in a case where the portion of the display panel 100 located in the second region B is bent onto the back of the portion of the display panel 100 located in the first region A, orthogonal projections of third light-emitting devices 123 on the portion of the substrate 110 located in the first region A and orthogonal projections of first light-emitting devices 121 on the substrate 110, are arranged in a line along the row direction in which the pixel circuits are arranged. In this case, third pixel circuits 133 coupled to the third light-emitting devices 123 and first pixel circuits 131 coupled to the light-emitting devices 121 are pixel circuits in a same row; and a part of the pixel circuits in the same row may be located on one of the two opposite sides of the transparent portion 160, and another part thereof may be located on the other of the two opposite sides of the transparent portion 160. In this case, at least one signal line coupled to the pixel circuits in the same row may include two sub-line segments, and the two sub-line segments are located on the two opposite sides of the transparent portion 160, and synchronously drive the pixel circuits in the row.

Figure 14:
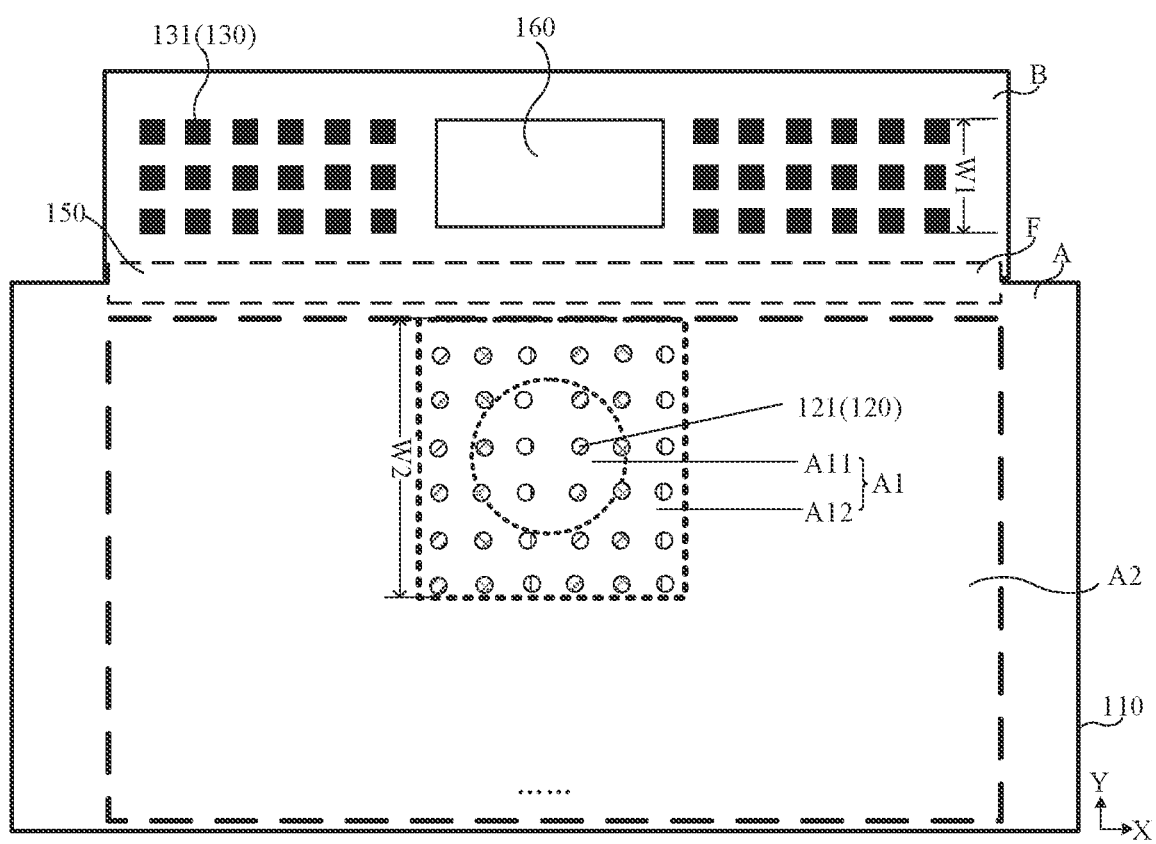
FIG. 14 is a structural diagram of yet another display panel, in accordance with some embodiments.

In some embodiments, as shown in FIG. 14, along the column direction (e.g., the direction Y in FIG. 14) in which the pixel circuits 130 are arranged, a width W1 of the pixel circuits 130 located in the second region B as a whole is less than or equal to a width W2 of the first display region A1. In this way, it may be possible to reduce a width of the second region B along the column direction in which the pixel circuits 130 are arranged, and reduce a size of the portion of the display panel 100 located in the second region B. In a case where the portion of the display panel 100 located in the second region B is bent onto the back of the portion of the display panel 100 located in the first region A, a region where the portion of the display panel 100 located in the second region B overlaps the portion of the display panel 100 located in the first region A is small, so that space occupied by the portion of the display panel 100 located in the second region B bent onto the back of the portion of the display panel 100 located in the first region A may be reduced, and in turn, there is enough space for providing other devices (e.g., a camera and a battery) on the back of the display panel 100.

In some embodiments, as shown in FIGS. 15A to 15E, the plurality of pixel circuits 130 located in the second region B are divided into at least two groups G. Different groups are arranged along the row direction (e.g., the direction X shown in FIGS. 15A to 15E) in which the pixel circuits are arranged. Each group G includes at least one row of pixel circuits 130. All rows of pixel circuits in the at least two groups G are in one-to-one correspondence with a plurality of rows of pixel circuits located in the second display region A2.

Figure 15A:
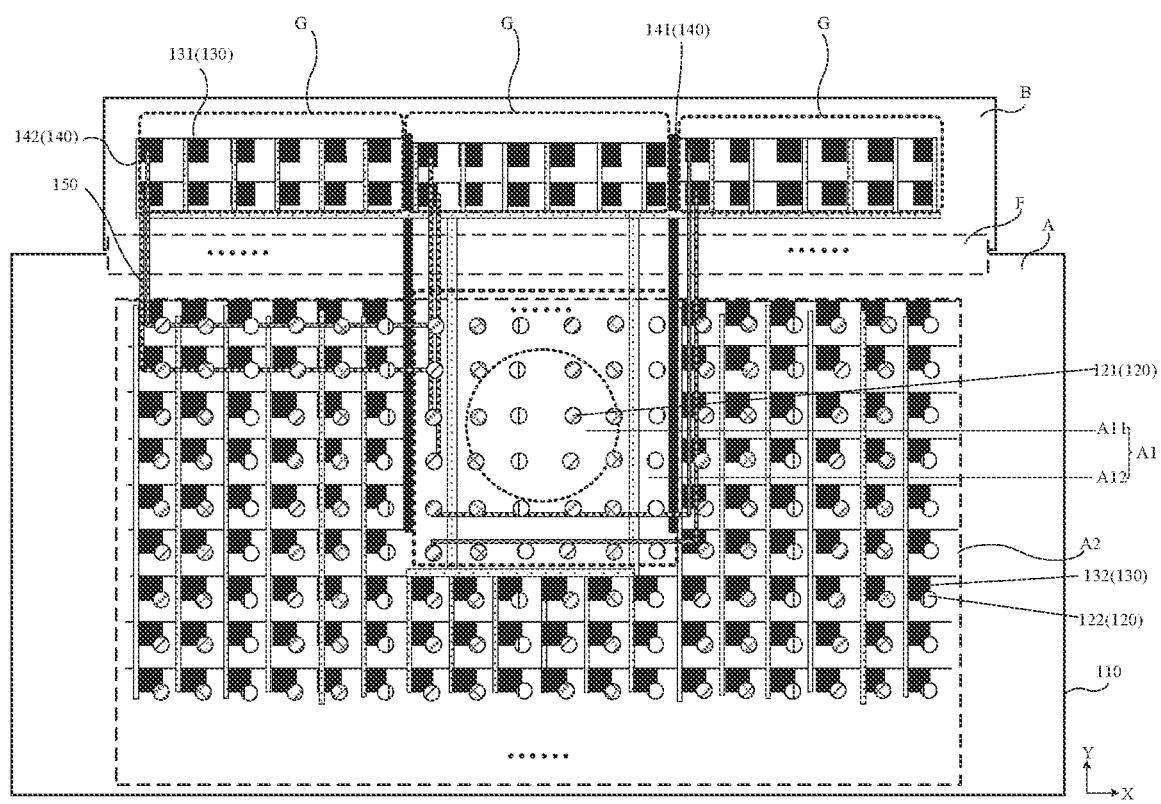
FIG. 15A is a structural diagram of yet another display panel, in accordance with some embodiments.
Figure 15B:
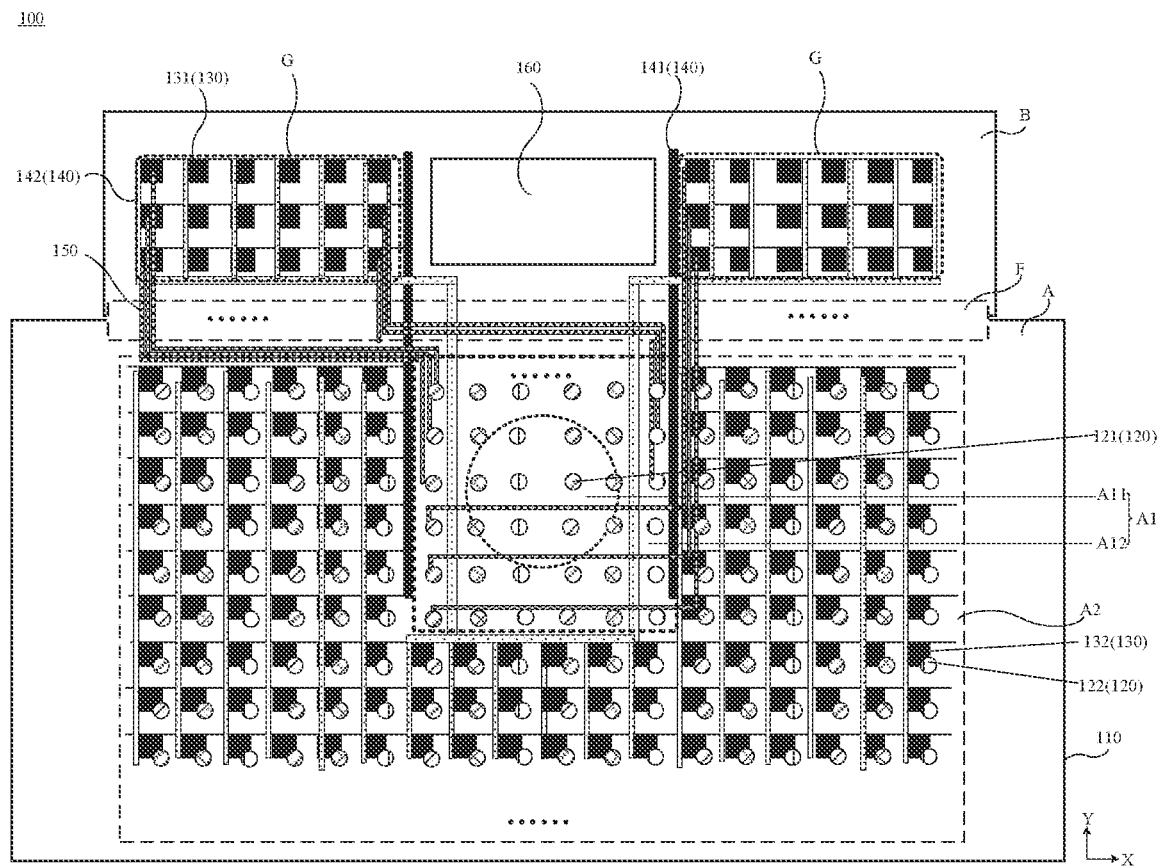
FIG. 15B is a structural diagram of yet another display panel, in accordance with some embodiments.
Figure 15C:
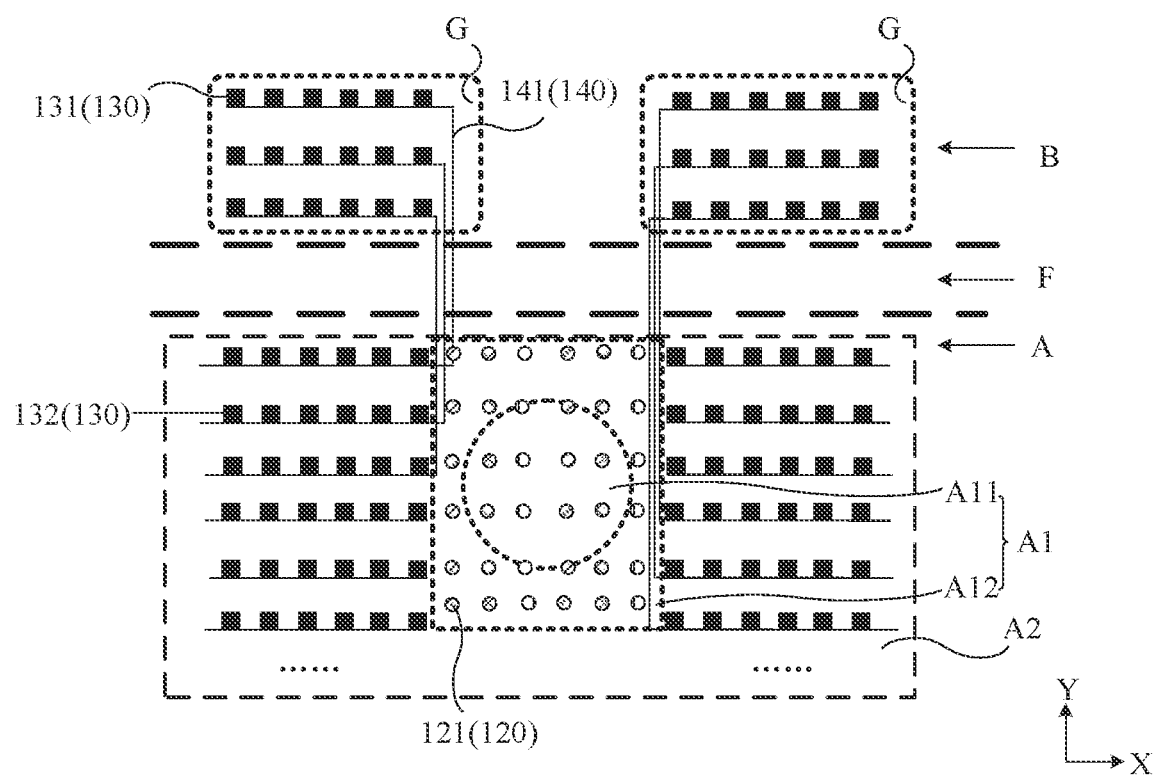
FIG. 15C is a diagram showing connection relationships between first pixel circuits and second pixel circuits, in accordance with some embodiments.
Figure 15D:
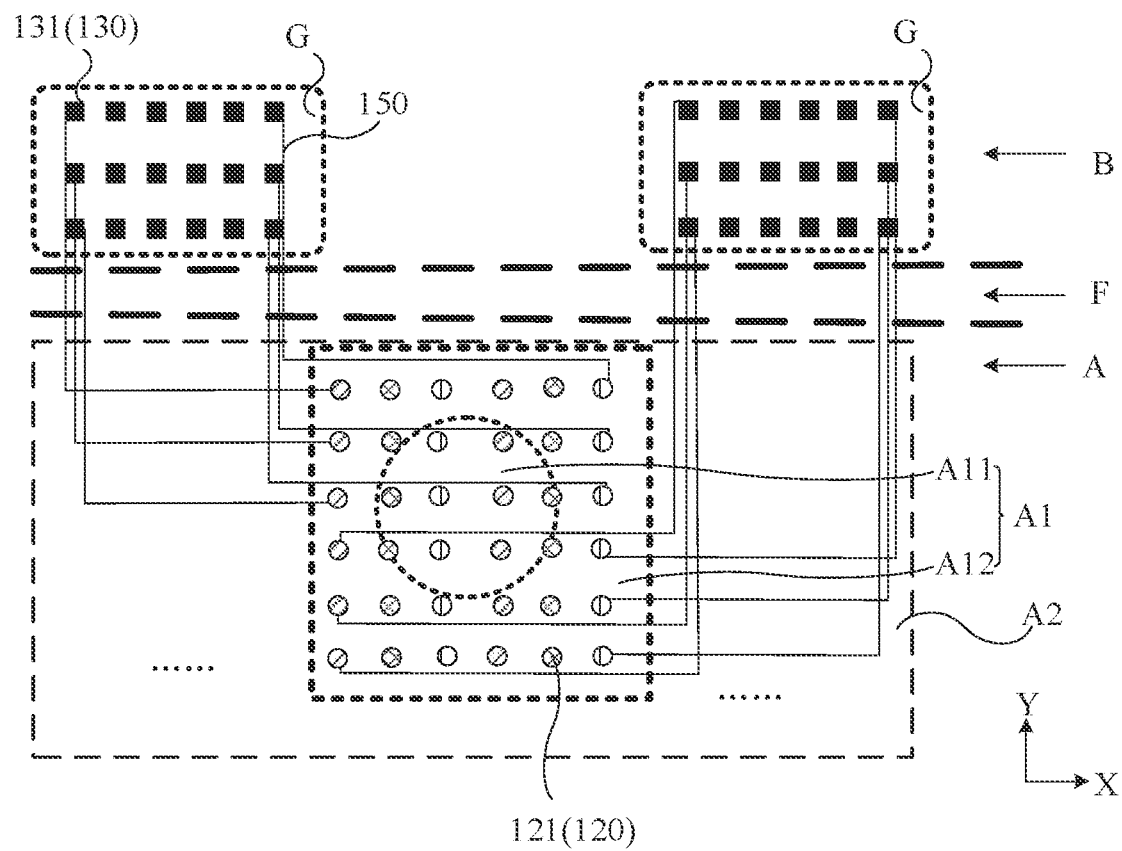
FIG. 15D is a diagram showing connection relationships between first pixel circuits and first light-emitting devices, in accordance with some embodiments.
Figure 15E:
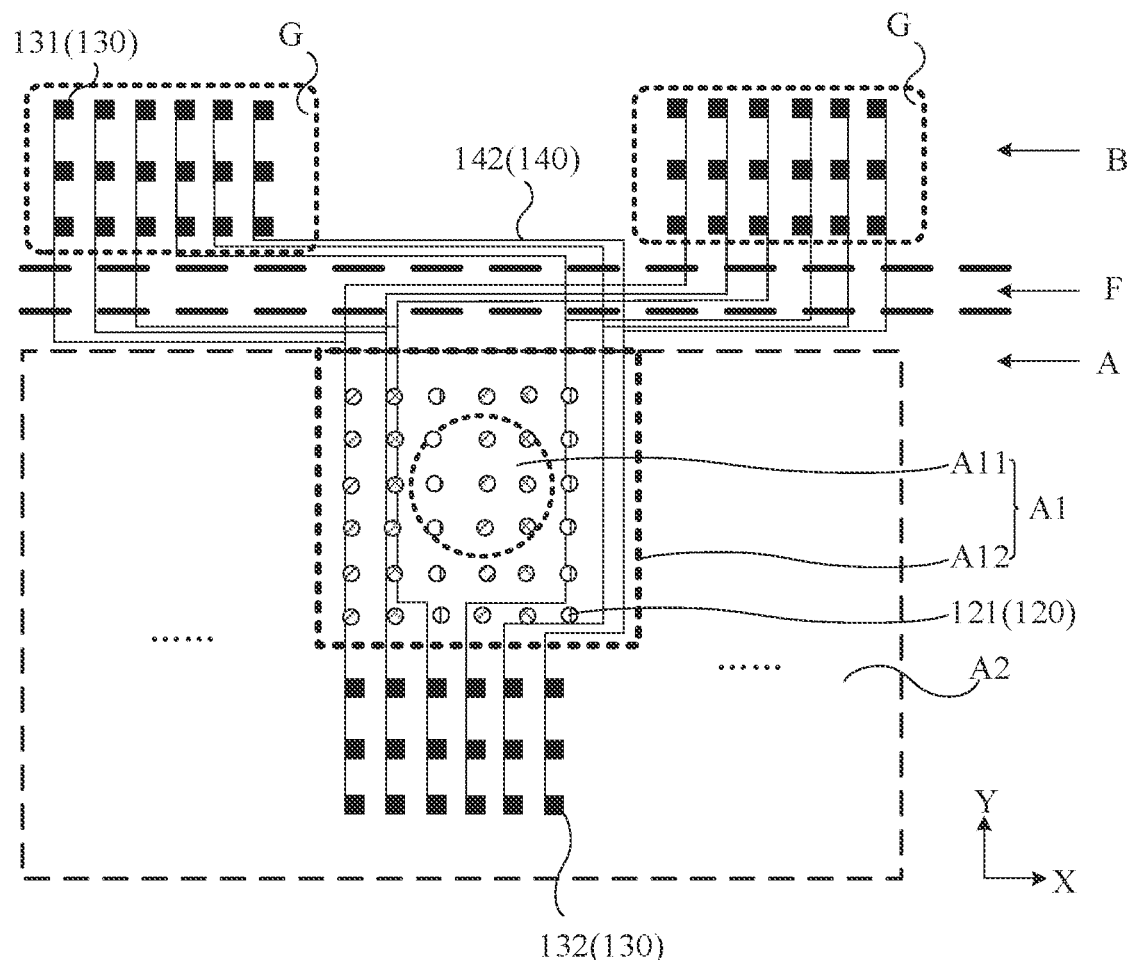
FIG. 15E is a diagram showing connection relationships between first pixel circuits and second pixel circuits, in accordance with some other embodiments.

For example, in a case where the plurality of pixel circuits 130 located in the second region B are normally arranged in an array of six rows and six columns, referring to FIG. 15A, the plurality of pixel circuits 130 located in the second region B may be divided into three groups, and pixel circuits in each group are arranged in an array of two rows and six columns; or, referring to FIG. 15B, the plurality of pixel circuits 130 located in the second region B may be divided into two groups, and pixel circuits in each group are arranged in an array of three rows and six columns. In this way, the width of the pixel circuits in the second region B as a whole along the column direction in which the pixel circuits are arranged may be reduced, thereby reducing the size of the portion of the display panel 100 located in the second region B. In a case where the portion of the display panel 100 located in the second region B is bent onto the back of the portion of the display panel 100 located in the first region A, the region where the portion of the display panel 100 located in the second region B overlaps the portion of the display panel 100 located in the first region A is small, so that the space occupied by the portion of the display panel 100 located in the second region B bent onto the back of the portion of the display panel 100 located in the first region A may be reduced, and in turn, there is enough space for providing other devices (e.g., the camera and the battery) on the back of the display panel 100.

Each row of pixel circuits in each group G and a corresponding row of pixel circuits located in the second display region A2 are coupled to at least one same signal line 140, so that a signal to which each row of pixel circuits in each group G responds is synchronized with a signal to which the corresponding row of pixel circuits located in the second display region A2 responds. For example, data signals may be synchronously written into each row of pixel circuits in each group G and the corresponding row of pixel circuits located in the second display region A2 in response to a synchronous gate driving signal. During display, each row of pixel circuits in each group G and the corresponding row of pixel circuits located in the second display region A2 may synchronously drive respective light-emitting devices coupled thereto. That is, light-emitting devices coupled to each row of pixel circuits in each group G emit light synchronously with light-emitting devices coupled to the corresponding row of pixel circuits located in the second display region A2.

For example, referring to FIG. 15A, the three groups correspond to six rows and six columns of first light-emitting devices in the first display region, and each of the three groups includes two rows and six columns of pixel circuits. In a first group (e.g., a group on a left side in FIG. 15A) in the three groups, a first row of pixel circuits is used to drive a first row of first light-emitting devices, and a second row of pixel circuits is used to drive a second row of first light-emitting devices. In a second group (e.g., a group in a middle in FIG. 15A) in the three groups, a first row of pixel circuits is used to drive a third row of first light-emitting devices, and a second row of pixel circuits is used to drive a fourth row of first light-emitting devices. In a third group (e.g., a group on a right side in FIG. 15A) in the three groups, a first row of pixel circuits is used to drive a fifth row of first light-emitting devices, and a second row of pixel circuits is used to drive a sixth row of first light-emitting devices.

For example, referring to FIG. 15B, the two groups correspond to six rows and six columns of first light-emitting devices in the first display region, and each of the two groups includes three rows and six columns of pixel circuits. In a first group (e.g., a group on a left side in FIG. 15B) in the two groups, a first row of pixel circuits is used to drive a first row of first light-emitting devices, a second row of pixel circuits is used to drive a second row of first light-emitting devices, and a third row of pixel circuits is used to drive a third row of first light-emitting devices. In a second group (e.g., a group on a right side in FIG. 15B) in the two groups, a first row of pixel circuits is used to drive a fourth row of first light-emitting devices, a second row of pixel circuits is used to drive a fifth row of first light-emitting devices, and a third row of pixel circuits is used to drive a sixth row of first light-emitting devices.

For example, a same column of pixel circuits in each group G and a corresponding column of pixel circuits located in the second display region A2 are coupled to at least one same signal line 140. For example, each column of pixel circuits in each group G and a corresponding column of pixel circuits located in the second display region A2 may receive a same data signal. For example, referring to FIG. 15A, a first column of pixel circuits in the first group (e.g., the group on the left side in FIG. 15A) in the three groups, a first column of pixel circuits in the second group (e.g., the group in the middle in FIG. 15A) in the three groups, and a first column of pixel circuits in the third group (e.g., the group on the right side in FIG. 15A) in the three groups are coupled to a signal line.

Figure 16A:
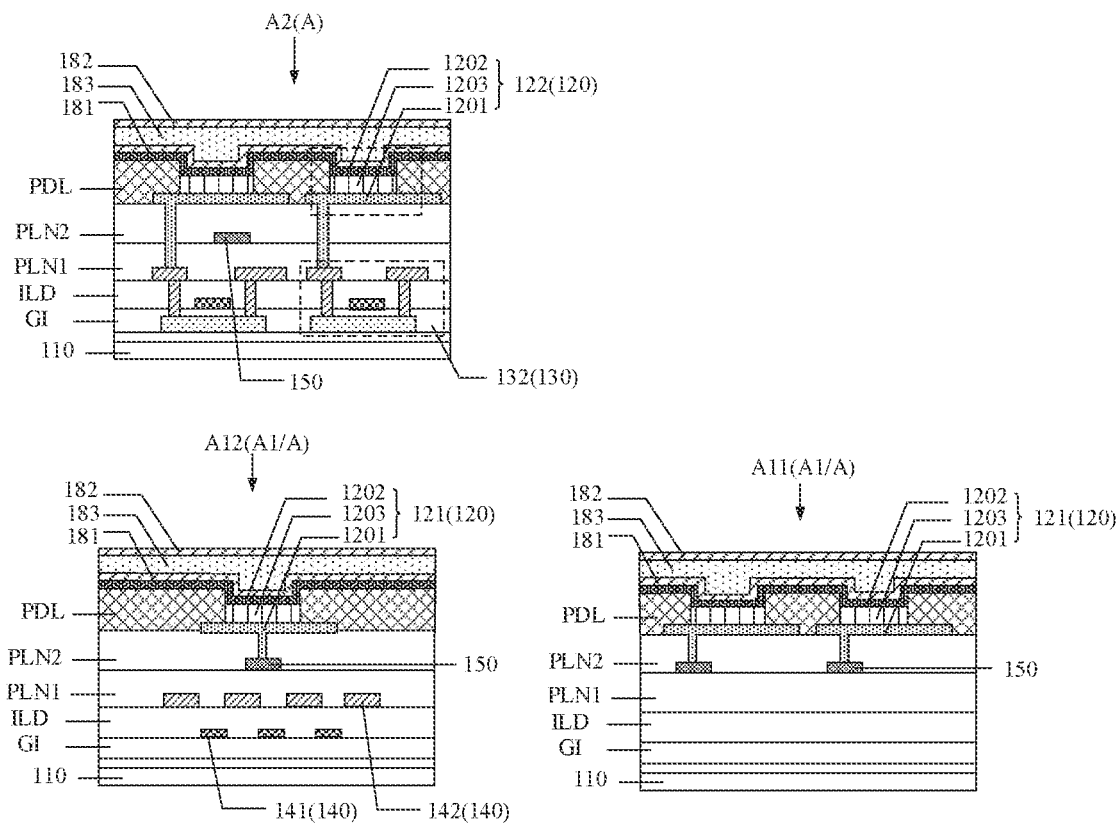
FIG. 16A is a structural diagram of yet another display panel, in accordance with some embodiments.
Figure 16B:
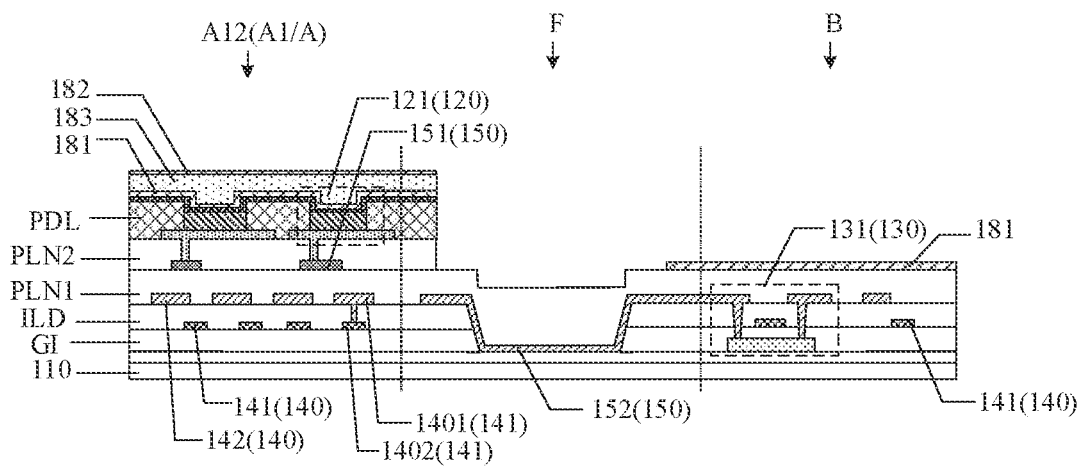
FIG. 16B is a structural diagram of yet another display panel, in accordance with some embodiments.

In some embodiments, as shown in FIGS. 16A and 16B, the display panel 100 further includes a first encapsulation layer 181, a second encapsulation layer 182 and a third encapsulation layer 183. The second encapsulation layer 182 is farther away from the substrate 110 than the first encapsulation layer 181. The third encapsulation layer 183 is located between the first encapsulation layer 181 and the second encapsulation layer 182. The first encapsulation layer 181 covers the plurality of pixel circuits 130 and the plurality of light-emitting devices 120. The second encapsulation layer 182 covers the second pixel circuits 132. The third encapsulation layer 183 covers the plurality of light-emitting devices 120.

For example, a material of the first encapsulation layer 181 includes an inorganic material, and a material of the second encapsulation layer 182 includes an inorganic material. That is, the first encapsulation layer 181 and the second encapsulation layer 182 are both inorganic encapsulation layers. The inorganic material may be, for example, silicon nitride, silicon oxide, or silicon oxynitride. The first encapsulation layer and the second encapsulation layer that are each made of the inorganic material have high compactness, and may prevent intrusion of water and oxygen. For example, a material of the third encapsulation layer includes an organic material. That is, the third encapsulation layer 183 is an organic encapsulation layer. The organic material may be a polymer material including a desiccant or a polymer material that may block moisture, such as polymer resin, so as to planarize a surface of the display panel and relieve stress of the first encapsulation layer and the second encapsulation layer. For example, the material of the third encapsulation layer 183 may further include a water absorbing material such as an alkali metal (e.g., Li or sodium (Na)), an alkaline earth metal (e.g., barium (Ba) or calcium (Ca)), or any other moisture-reactive metal (e.g., Al or ferrum (Fe)); the material of the third encapsulation layer 183 may further include an alkali metal oxide (e.g., lithium oxide ($Li_2O$) or sodium oxide ($Na_2O$)), an alkaline earth metal oxide (e.g., magnesium oxide (MgO), calcium oxide (CaO), or barium oxide (BaO)), a sulfate (e.g., anhydrous magnesium sulfate ($MgSO_4$)), a metal halide (e.g., calcium chloride ($CaCl_2$)), or a perchlorate (e.g., magnesium perchlorate ($Mg(ClO_4)_2$)), so as to absorb substances invading the interior, such as water and oxygen.

In this case, the first encapsulation layer 181, the second encapsulation layer 182 and the third encapsulation layer 183 cover the light-emitting devices 120 and the pixel circuits 130 that are located in the first region A, and the first encapsulation layer 181 also covers the pixel circuits 130 located in the second region B. Therefore, moisture and oxygen from an external environment may be prevented from intruding into the interior of the display panel 100. For example, electrical properties of the light-emitting devices and the pixel circuits in the display panel may be prevented from being affected due to the reaction between the moisture and oxygen, and the light-emitting devices and the pixel circuits in the display panel, thereby reducing the performance and a service life of the display panel 100.

Figure 16C:
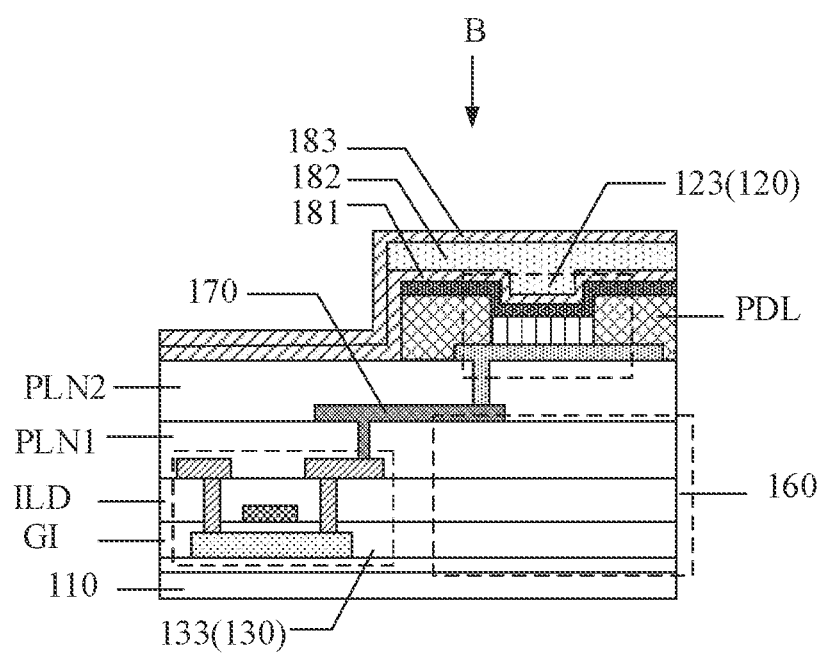
FIG. 16C is a structural diagram of yet another display panel, in accordance with some embodiments.

In some embodiments, as shown in FIG. 16C, in a case where the plurality of light-emitting devices 120 includes the third light-emitting devices 123, the second encapsulation layer 182 further covers the third light-emitting devices 123.

It can be understood that, the first encapsulation layer 181 and the second encapsulation layer 182 both cover the light-emitting devices 120 and the pixel circuits 130 that are located in the second region B, and the third encapsulation layer 183 covers the light-emitting devices 120 (i.e., the third light-emitting devices 123) located in the second region B. In this case, the moisture and oxygen in the external environment may be prevented from intruding into the interior of the display panel 100 from the second region B. For example, electrical properties of the third light-emitting devices 123, the first pixel circuits 131 and the third pixel circuits 133 may be prevented from being affected due to the reaction between the moisture and oxygen, and the third light-emitting devices 123, the first pixel circuits 131 and the third pixel circuits 133, thereby reducing the performance and the service life of the display panel 100.

Figure 17A:
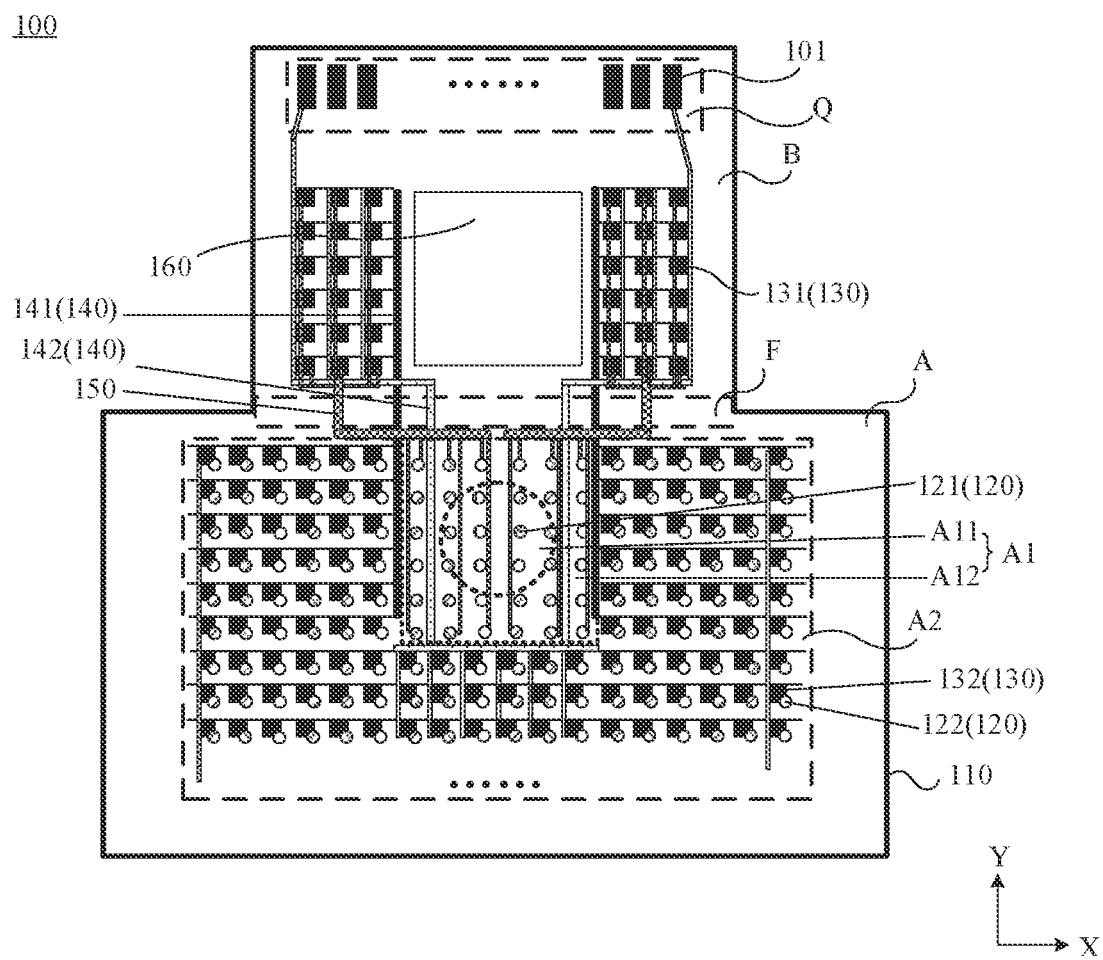
FIG. 17A is a structural diagram of yet another display panel, in accordance with some embodiments.
Figure 17B:
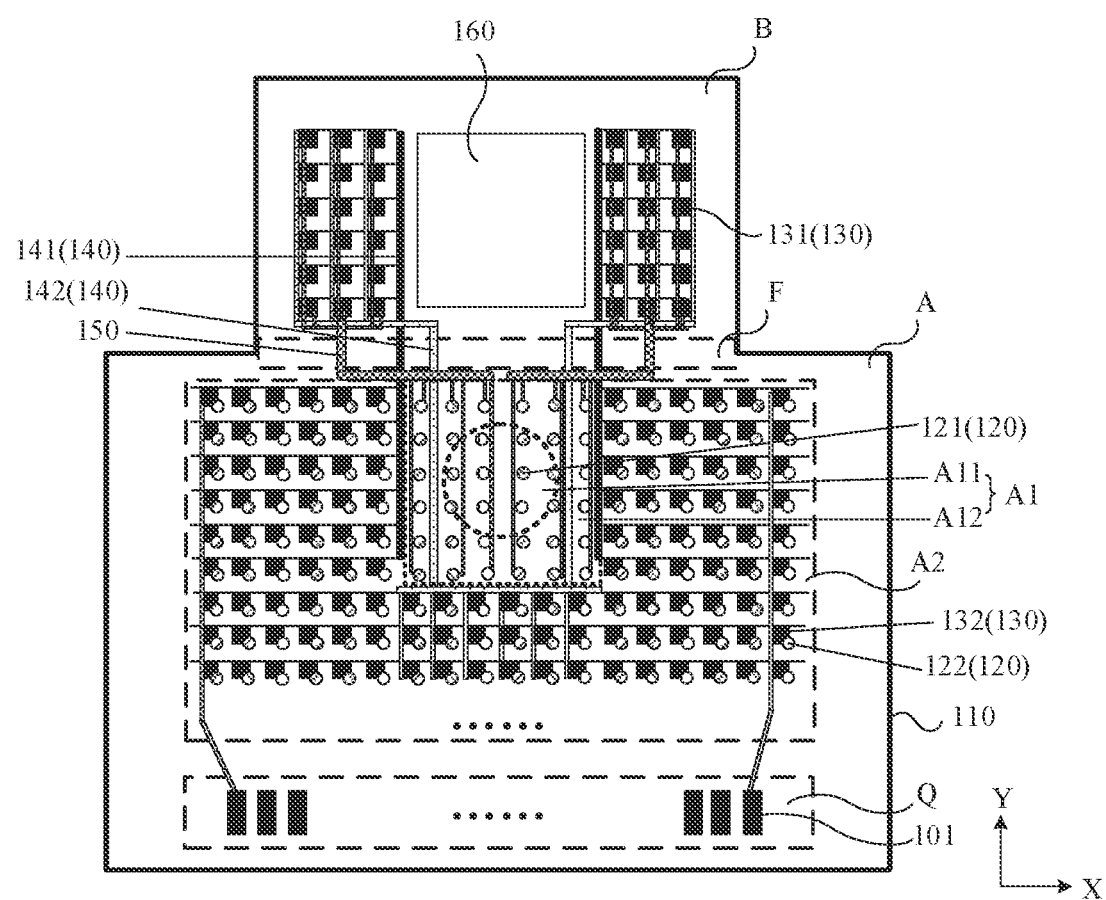
FIG. 17B is a structural diagram of yet another display panel, in accordance with some embodiments.

In some embodiments, as shown in FIGS. 17A and 17B, the display panel 100 further has a bonding region Q. In a case where the display panel 100 has the second region B and the bending region F, as shown in FIG. 17A, the bonding region Q is located on a side of the second region B away from the bending region F; or, as shown in FIG. 17B, the bonding region Q is located on a side of the first region A away from the bending region F. The display panel 100 is configured to bond a driver integrated circuit (IC) in the bonding region Q.

For example, as shown in FIGS. 17A and 17B, the display panel 100 further includes a plurality of pads 101 disposed in the bonding region Q. The plurality of signal lines 140 extend to the bonding region Q, and are coupled to the driver IC through the plurality of pads 101.

It can be understood that, in a case where the bonding region Q is located on the side of the second region B away from the bending region F, there is no bonding region Q on the side of the first region A away from the bending region F, and no pads 101 are provided either; in this way, the bezel of the display panel 100 on the side of the first region A away from the bending region F may be narrowed, and the bezel of the display panel 100 is not widened, which makes it easy to achieve the narrow bezel of the display panel 100. In addition, in a process of bending the portion of the display panel 100 located in the second region B to the back of the portion of the display panel 100 located in the first region A, the driver IC is also bent onto the back of the portion of the display panel 100 located in the first region A correspondingly. That is, the driver IC and the portion of the display panel 100 located in the second region B may be synchronously bent, thereby saving processes.

In a case where the bonding region Q is located on the side of the first region A away from the bending region F, in a process of bending the driver IC to the back of the display panel 100, a portion of the display panel 100 on the side of the first region A away from the bending region F is also bent. Consequently, it may be possible to narrow the bezel of the display panel 100 on the side of the first region A away from the bending region F, and make it easy to achieve the narrow bezel of the display panel 100.

It will be noted that, FIGS. 1B, 3, 6, 7, 9A, 10A, 11, 12A, 12B, 15A to 15E, and 17A to 17B merely illustrate connections of wires, and do not illustrate the layout of actual wiring. In practice, the wiring manner may be designed in a case of ensuring that no signal interference to the wires occurs.

Figure 18:
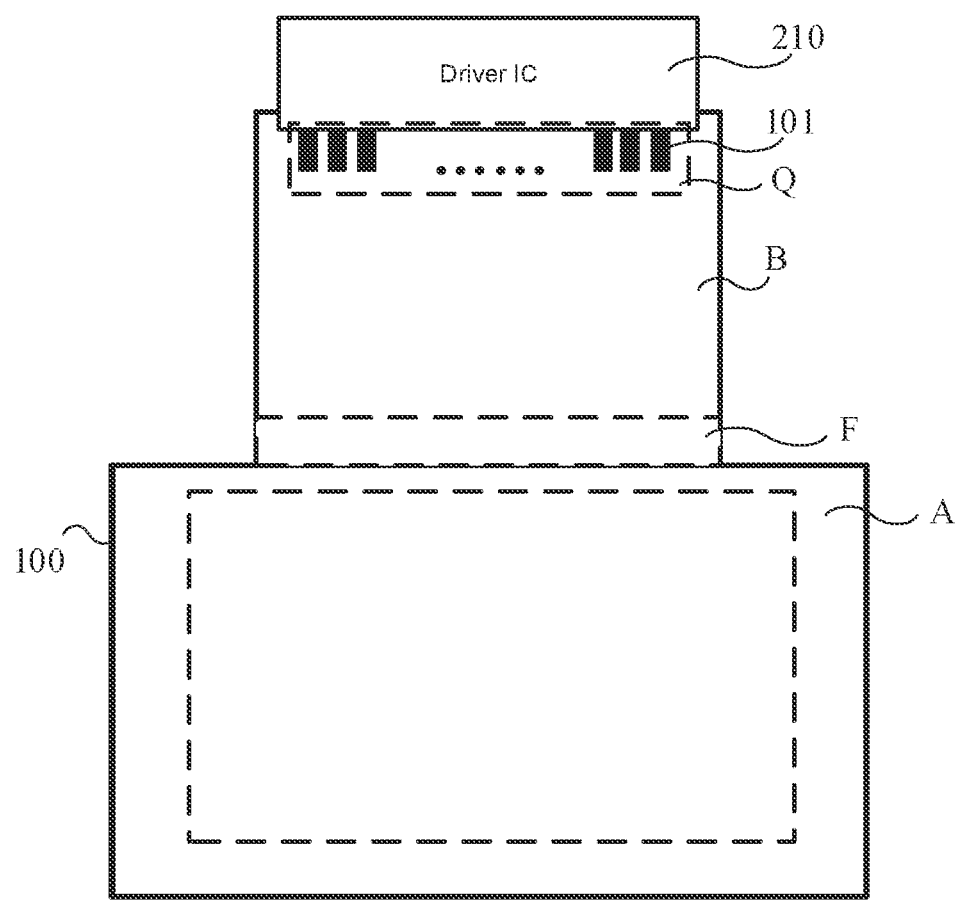
FIG. 18 is a structural diagram of another display apparatus, in accordance with some embodiments.

As shown in FIG. 18, the display apparatus 200 provided in the embodiments of the present disclosure further includes the driver IC 210. The driver IC 210 is bonded to the display panel 100.

It can be understood that, the driver IC 210 is bonded in the bonding region Q of the display panel 100. For example, the driver IC 210 includes a source IC, which is coupled to signal lines (e.g., the second signal lines) in the display panel 100, so as to provide data signals to the signal lines.

For example, the driver IC 210 may be a chip on film (COF). For example, the driver IC 210 is disposed on a flexible printed circuit board (FPC), and the FPC is bonded to the display panel 100. For example, in a case where the display panel 100 includes the pads 101, pins of the FPC are bonded to the pads 101. Alternatively, for example, the driver IC 210 may be directly disposed on the display panel 100.

The display apparatus 200 may be any apparatus that displays an image whether in motion (e.g., a video) or stationary (e.g., a static image), and whether textual or graphical. More specifically, it is contemplated that the embodiments may be implemented in or associated with a variety of electronic devices. The variety of electronic devices may include, but are not limited to, mobile phones, wireless devices, personal data assistants (PDAs), hand-held or portable computers, global positioning system (GPS) receivers/navigators, cameras, MPEG-4 Part 14 (MP4) video players, video cameras, game consoles, watches, clocks, calculators, television (TV) monitors, flat-panel displays, computer monitors, automobile displays (e.g., odometer displays), navigators, cockpit controllers and/or displays, camera view displays (e.g., displays of rear-view cameras in vehicles), electronic photos, electronic billboards or signs, projectors, architectural structures, packagings, and aesthetic structures (e.g., displays for displaying an image of a piece of jewelry).

Beneficial effects of the display apparatus are same as those of the display panel described in the above embodiments, and details will not be repeated here.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel having a first region, wherein the first region includes a first display region and a second display region; the first display region includes a first sub-region and a second sub-region;

the display panel comprises:
a substrate;
a plurality of light-emitting devices disposed on the substrate, wherein the plurality of light-emitting devices include first light-emitting devices located in the first display region and second light-emitting devices located in the second display region;
a plurality of pixel circuits disposed on the substrate, wherein the plurality of pixel circuits include first pixel circuits coupled to the first light-emitting devices and second pixel circuits coupled to the second light-emitting devices, the first pixel circuits are located outside the first display region, and the second pixel circuits are located in the second display region; and
a plurality of signal lines disposed on the substrate, wherein the plurality of signal lines are coupled to the plurality of pixel circuits; the plurality of signal lines are configured to provide operating signals to the plurality of pixel circuits; each of at least one signal line of the plurality of signal lines is coupled to at least one first pixel circuit; and an orthogonal projection of the at least one signal line on the substrate overlaps the second sub-region, and does not overlap the first sub-region.

2. The display panel according to claim 1, wherein the display panel further has a bending region and a second region; the first region and the second region are connected through the bending region; the display panel is configured to bend a portion of the display panel located in the second region onto a back of a portion of the display panel located in the first region by bending a portion of the display panel located in the bending region;

one or more first pixel circuits are located in the second region;
the portion of the display panel located in the second region is bent onto the back of the portion of the display panel located in the first region, and orthogonal projections of the one or more first pixel circuits located in the second region on a portion of the substrate located in the first region does not overlap the first display region.

3. The display panel according to claim 2, wherein the at least one signal line has at least one opening, and the at least one opening is located in the bending region.

4. The display panel according to claim 2, wherein each of the at least one signal line includes:
a first pattern located in the bending region;
a second pattern located in the first region, wherein the second pattern is coupled to at least one second pixel circuit and the first pattern; and
a third pattern located in the second region, wherein the third pattern is coupled to the at least one first pixel circuit and the first pattern, and a tensile modulus of the first pattern is greater than a tensile modulus of the second pattern and a tensile modulus of the third pattern.

5. The display panel according to claim 4, wherein the plurality of signal lines include first signal lines and second signal lines; the first signal lines each include a first pattern, a second pattern and a third pattern; and first patterns of the first signal lines and the second signal lines are made of a same material.

6. The display panel according to claim 1, further comprising a plurality of connection leads disposed on the substrate, wherein
a first light-emitting device is coupled to a first pixel circuit through a connection lead, and a portion of at least one connection lead located in at least the first display region is transparent.

7. The display panel according to claim 6, wherein the at least one connection lead includes:
a fourth pattern located in the first display region, wherein the fourth pattern is coupled to a first light-emitting device; and
a fifth pattern located outside the first display region, wherein the fifth pattern is coupled to the fourth pattern and a first pixel circuit, and a tensile modulus of the fifth pattern is greater than a tensile modulus of the fourth pattern.

8. The display panel according to claim 7, wherein the at least one signal line includes a second signal line, and the fifth pattern and the second signal line are made of a same material.

9. The display panel according to claim 2, wherein the portion of the display panel located in the second region includes a transparent portion;
orthogonal projections of the first pixel circuits on the substrate do not overlap the transparent portion;
in a case where the portion of the display panel located in the second region is bent onto the back of the portion of the display panel located in the first region, the first sub-region is located in a region where an orthogonal projection of the transparent portion on the portion of the substrate located in the first region is located.

10. The display panel according to claim 9, wherein the plurality of light-emitting devices further include third light-emitting devices; the third light-emitting devices are located on the transparent portion;
the plurality of pixel circuits further include third pixel circuits; the third pixel circuits are located in the second region; the third pixel circuits are coupled to the third light-emitting devices; orthogonal projections of the third pixel circuits on the substrate do not overlap an orthogonal projection of the transparent portion on the substrate;
in a case where the portion of the display panel located in the second region is bent onto the back of the portion of the display panel located in the first region, orthogonal projections of the third light-emitting devices on the portion of the substrate located in the first region are located within the first display region, and do not overlap orthogonal projections of the first light-emitting devices on the substrate.

11. The display panel according to claim 10, wherein in a case where the portion of the display panel located in the second region is bent onto the back of the portion of the display panel located in the first region, an arrangement of the first light-emitting devices and the third light-emitting devices as a whole is same as an arrangement of the second light-emitting devices.

12. The display panel according to claim 10, further comprising transparent conductive lines disposed on the substrate, wherein the third light-emitting devices are coupled to the third pixel circuits through the transparent conductive lines.

13. The display panel according to claim 9, wherein the transparent portion is an opening, and a depth direction of the opening is perpendicular to a plane where a portion of the substrate located in the second region is located.

14. The display panel according to claim 9, wherein pixel circuits located in the second region are arranged in an array, and along a row direction in which the pixel circuits in the second region are arranged, the pixel circuits in the second region are located on at least one of two opposite sides of the transparent portion.

15. The display panel according to claim 9, wherein along a column direction in which pixel circuits located in the second region are arranged, a width of the pixel circuits located in the second region as a whole is less than or equal to a width of the first display region.

16. The display panel according to claim 15, wherein the pixel circuits located in the second region are divided into at least two groups; different groups are arranged along a row direction in which the pixel circuits located in the second region are arranged, each group includes at least one row of pixel circuits, and all rows of pixel circuits in the at least two groups are in one-to-one correspondence with a plurality of rows of pixel circuits located in the second display region; each row of pixel circuits in each group and a corresponding row of pixel circuits located in the second display region are coupled to at least one same signal line.

17. The display panel according to claim 1, further comprising:
a first encapsulation layer covering the plurality of pixel circuits and the plurality of light-emitting devices;
a second encapsulation layer farther away from the substrate than the first encapsulation layer, wherein the second encapsulation layer covers the second pixel circuits; and
a third encapsulation layer located between the first encapsulation layer and the second encapsulation layer, wherein the third encapsulation layer covers the plurality of light-emitting devices.

18. The display panel according to claim 17, wherein the plurality of light-emitting devices include third light-emitting devices, and the second encapsulation layer further covers the third light-emitting devices.

19. The display panel according to claim 2, wherein the display panel further has a bonding region;
the bonding region is located on a side of the second region away from the bending region; or, the bonding region is located on a side of the first region away from the bending region.

20. A display apparatus, comprising:
the display panel according to claim 1; and
a sensor disposed on a back of a portion of the display panel located in the first display region, wherein an orthogonal projection of the sensor on the display panel is located in the first sub-region of the first display region.

* * * * *